US012787262B2

(12) United States Patent
Park et al.

(10) Patent No.: US 12,787,262 B2
(45) Date of Patent: Nov. 3, 2026

(54) SEMICONDUCTOR DEVICE

(71) Applicant: SAMSUNG ELECTRONICS CO., LTD., Suwon-si (KR)

(72) Inventors: Dong-Sik Park, Suwon-si (KR); Jae Won Na, Suwon-si (KR); Jihee Jun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 448 days.

(21) Appl. No.: 18/424,577

(22) Filed: Jan. 26, 2024

(65) Prior Publication Data

US 2025/0016988 A1 Jan. 9, 2025

(30) Foreign Application Priority Data

Jul. 3, 2023 (KR) ........................ 10-2023-0085943

(51) Int. Cl.
*H10B 12/00* (2023.01)

(52) U.S. Cl.
CPC ........... *H10B 12/482* (2023.02); *H10B 12/03* (2023.02); *H10B 12/488* (2023.02); *H10B 12/50* (2023.02)

(58) Field of Classification Search
CPC .................................................. H10D 30/6728
See application file for complete search history.

(56) References Cited

U.S. PATENT DOCUMENTS 8,139,413 B2 3/2012 Kim et al.
11,017,843 B2 5/2021 Sharma et al.
11,101,283 B2 8/2021 Kim et al.
11,393,823 B2 7/2022 Han
2009/0201733 A1 8/2009 Kim et al.
2020/0043941 A1 2/2020 Kim et al.
2020/0411078 A1* 12/2020 Sharma ............... G11C 11/4085
2022/0037326 A1 2/2022 Han
2022/0328490 A1 10/2022 Han
2022/0375941 A1 11/2022 Lee et al.
2023/0371243 A1* 11/2023 Lee ...................... H10B 12/488

FOREIGN PATENT DOCUMENTS

KR 10-1056113 B1 8/2011
KR 10-1458792 B1 11/2014
KR 10-2020-0015177 A 2/2020
KR 10-2022-0016709 A 2/2022
KR 10-2022-0156718 A 11/2022

* cited by examiner

*Primary Examiner* — Christine S. Kim
*Assistant Examiner* — Cole Leon Lindsey
(74) *Attorney, Agent, or Firm* — MORGAN, LEWIS & BOCKIUS LLP

(57) ABSTRACT

A semiconductor device includes a substrate including cell array and peripheral regions, a bit line positioned in the cell array region and extending in a first direction, a shielding line extending in the first direction from the cell array region to the peripheral region and positioned adjacent to the bit line in a second direction crossing the first direction, a shielding contact line positioned in the peripheral region, extending in the second direction, and connected to the shielding line, a channel pattern positioned on the bit line and extending in a direction vertical from the bit line, a word line extending in the second direction and positioned on the channel pattern, a gate insulation pattern positioned between the channel pattern and the word line, an insulation pattern positioned on the word line, a landing pad connected to the channel pattern, and a data storage pattern connected to the landing pad.

20 Claims, 28 Drawing Sheets

SEMICONDUCTOR DEVICE

CROSS-REFERENCE TO RELATED APPLICATION

This application claims priority to and the benefit of Korean Patent Application No. 10-2023-0085943 filed in the Korean Intellectual Property Office on Jul. 3, 2023, the entire contents of which are herein incorporated by reference.

BACKGROUND

1. Technical Field

The present disclosure relates to a semiconductor device, and more particularly to a semiconductor device including a shielding line and a shielding contact line.

2. Discussion of Related Art

The performance and cost of semiconductor memory devices may be improved by increasing integration of the devices. In the case of two-dimensional or flat area semiconductor memory devices, the integration thereof may be determined by the area occupied by a unit memory cell, and may be affected by a level of a fine pattern formation technology. However, since expensive equipment may be required for a pattern miniaturization, the integration of the 2D semiconductor memory devices may be constrained.

To lower the expense of manufacturing semiconductor memory devices, a vertical channel transistor in which a channel extends in a vertical direction has been proposed, including finely form the patterns constituting the device with such a semiconductor memory. However, as the width of the fine patterns gradually decreases, a parasitic capacitance may increase, and the performance of the semiconductor device may be deteriorated.

SUMMARY

One aspect of the present disclosure is to provide a semiconductor device with improved reliability and productivity.

A semiconductor device according to an embodiment includes a substrate including a cell array region and a peripheral region surrounding the cell array region; a bit line positioned in the cell array region and extending in a first direction; a shielding line extending in the first direction from the cell array region to the peripheral region and positioned adjacent to the bit line in a second direction crossing the first direction; a shielding contact line positioned in the peripheral region, extending in the second direction, and connected to the shielding line; a channel pattern positioned on the bit line and extending in a direction vertical from the bit line; a word line that extends in the second direction and is positioned on the channel pattern; a gate insulation pattern positioned between the channel pattern and the word line; an insulation pattern positioned on the word line; a landing pad connected to the channel pattern; and a data storage pattern connected to the landing pad.

A semiconductor device according to an embodiment includes a substrate including a cell array region and a peripheral region surrounding the cell array region; a plurality of bit lines positioned in the cell array region and extending in a first direction; a plurality of shielding lines extending in the first direction from the cell array region to the peripheral region and positioned alternately with the plurality of bit lines; a first shielding contact line extending in a second direction intersecting the first direction in the peripheral region and connected to an end portion of first shielding lines of the plurality of shielding lines; a second shielding contact line extending in the second direction in the peripheral region and connected to an end portion of second shielding lines of the plurality of shielding lines; a channel pattern positioned on the plurality of bit lines and extending in a direction vertical to an upper surface of the plurality of bit lines; a word line extending in the second direction and positioned on the channel pattern; a gate insulation pattern positioned between the channel pattern and the word line; an insulation pattern positioned on the word line; a landing pad connected to the channel pattern; and a data storage pattern connected to the landing pad.

A semiconductor device according to an embodiment incudes a substrate including a cell array region and a peripheral region surrounding the cell array region; a plurality of bit lines positioned in the cell array region and extending in a first direction; a plurality of shielding lines extending in the first direction from the cell array region to the peripheral region and positioned alternately with the plurality of bit lines; a shielding contact line extending in a second direction intersecting the first direction in the peripheral region and connected to the plurality of shielding lines; a channel pattern positioned on the plurality of bit lines and extending in a direction vertical to an upper surface of the plurality of bit lines; a word line extending in the second direction; a gate insulation pattern positioned between the channel pattern and the word line; an insulation pattern positioned on the word line; a landing pad connected to the channel pattern; a data storage pattern connected to the landing pad; and a conductive via connected to a portion of the shielding contact line in the peripheral region.

According to an embodiment, by positioning the shielding contact line connected to the plurality of shielding lines positioned between the bit lines in the peripheral region surrounding the cell array region, it is possible to improve the contact area between components constituting the semiconductor device and the shielding contact line.

DETAILED DESCRIPTION

Figure 1:
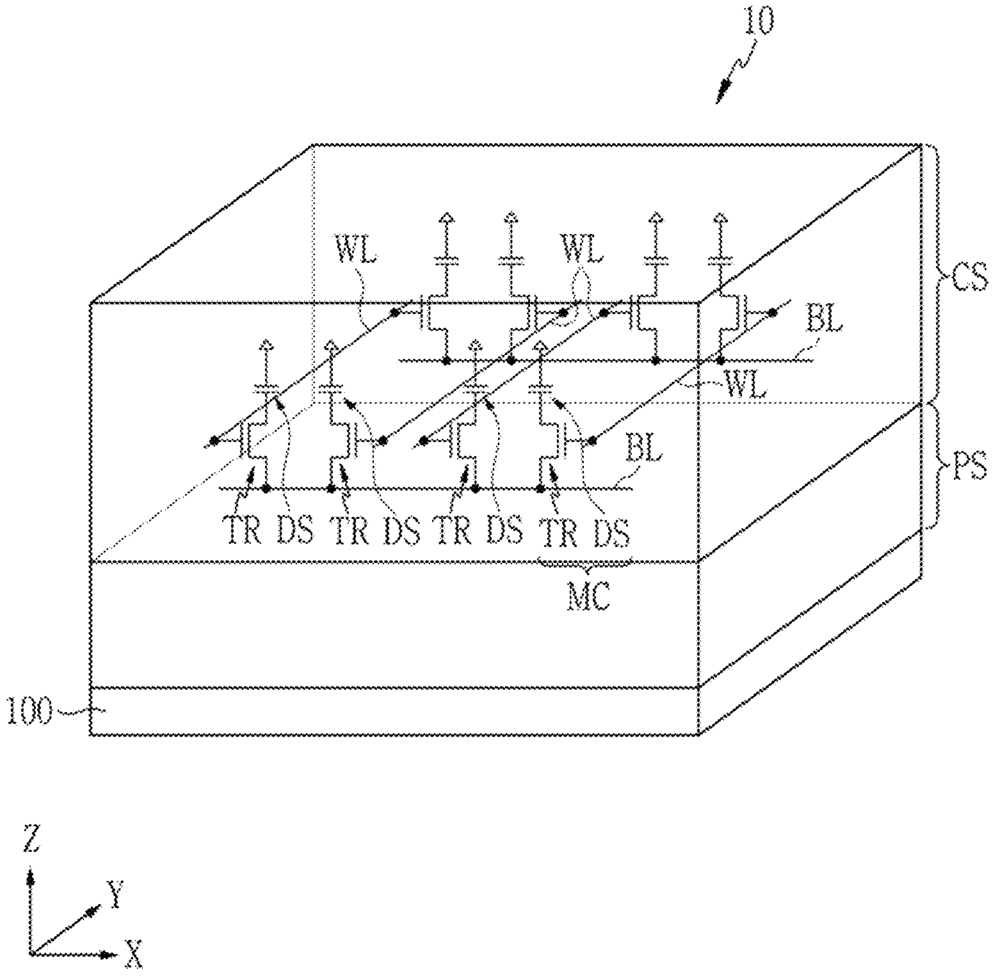
FIG. 1 is a perspective view schematically showing a semiconductor memory device according to an embodiment.

In the following detailed description, embodiments of the present disclosure will be described more fully hereinafter with reference to the accompanying drawings. As those skilled in the art would realize, embodiments may be modified in various different ways, all without departing from the spirit or scope of the present disclosure.

In order to clarify the present disclosure, parts that are not connected with the description may be omitted, and the same elements or equivalents are referred to by the same reference numerals throughout the specification.

Further, since sizes and thicknesses of constituent members shown in the accompanying drawings are arbitrarily given for better understanding and ease of description, the present disclosure is not limited to the illustrated sizes and thicknesses. In the drawings, the thickness of layers, films, panels, regions, etc., are exaggerated for clarity. In the drawings, for better understanding and ease of description, thicknesses of some layers and areas are excessively displayed.

It will be understood that when an element such as a layer, film, region, or substrate is referred to as being "on" another element, it can be directly on the other element or intervening elements may also be present. When an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise", and variations such as "comprises" or "comprising", will be understood to imply the inclusion of stated elements but not the exclusion of any other elements.

Further, in the specification, the phrase "on a plane" means when an object portion is viewed from above, and the phrase "on a cross-section" means when a cross-section taken by vertically cutting an object portion is viewed from the side.

Hereinafter, a semiconductor device according to an embodiment is described with reference to FIG. 1, FIG. 2, FIG. 3, FIG. 4, FIG. 5A, and FIG. 5B.

Figure 2:
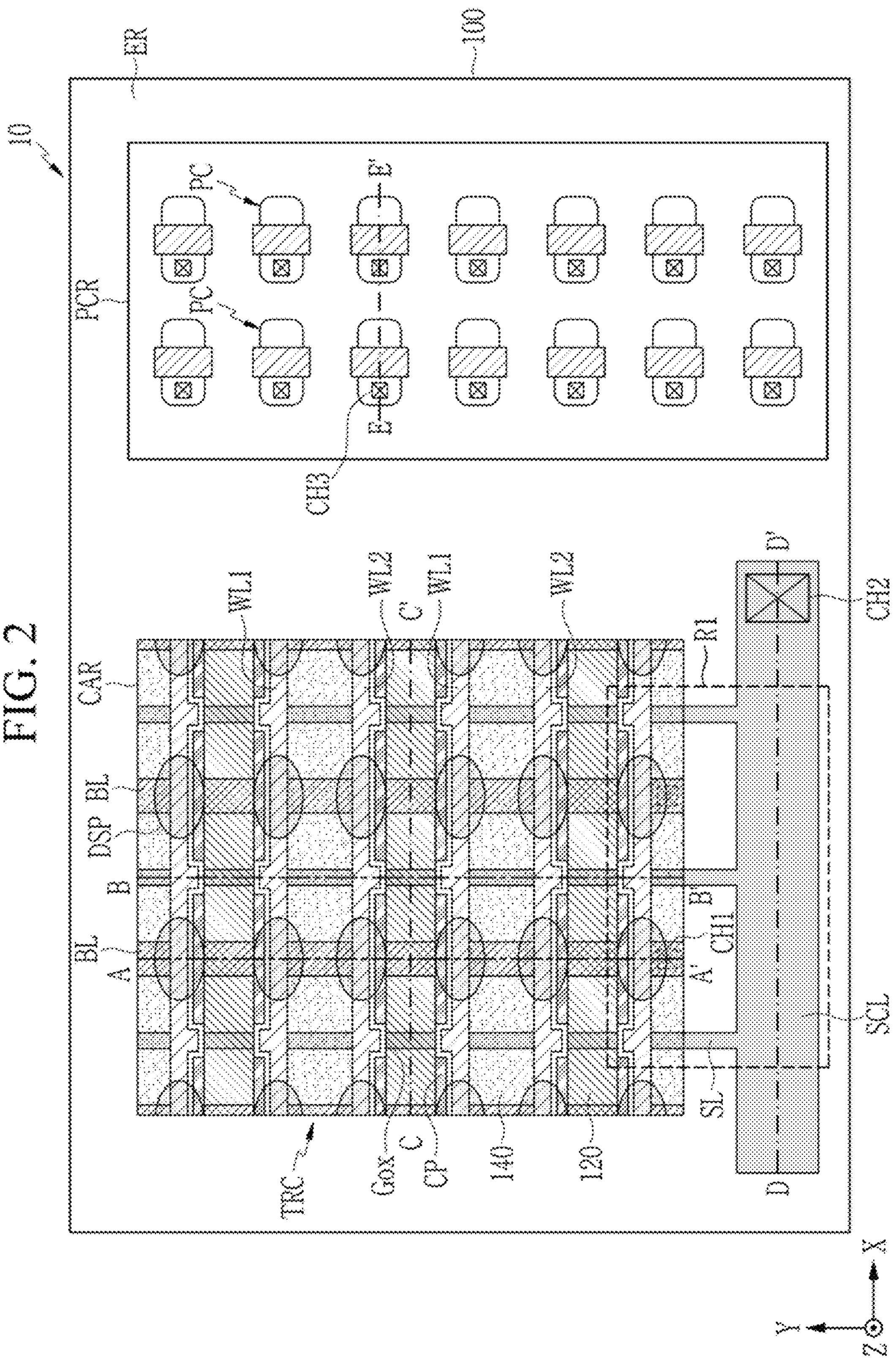
FIG. 2 is a top plan view schematically showing a semiconductor device according to an embodiment.
Figure 3:
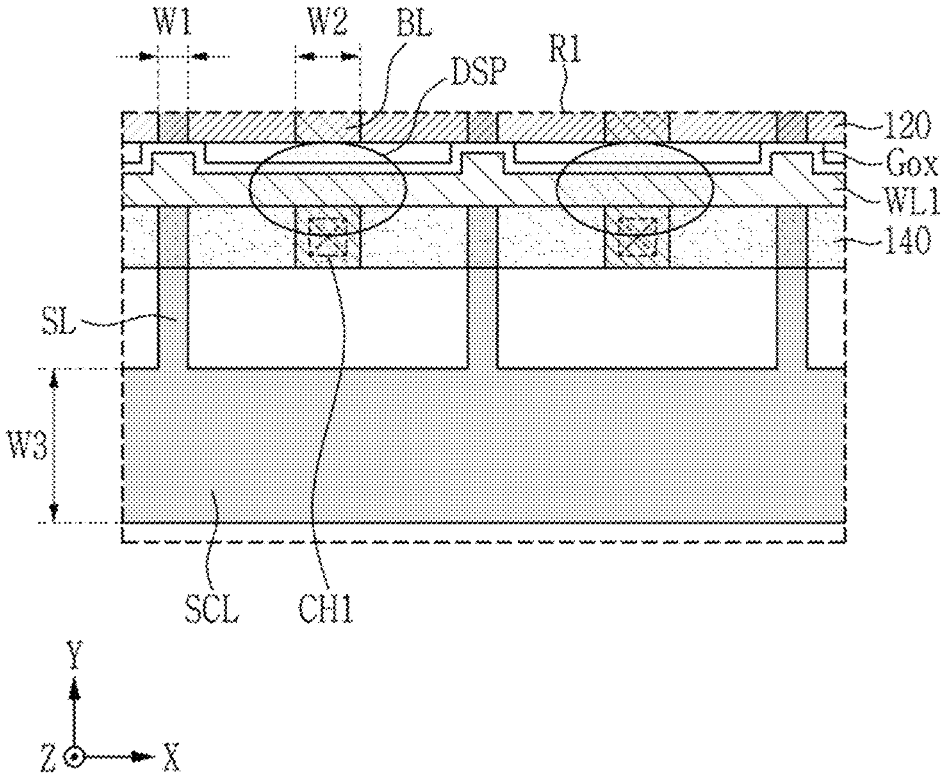
FIG. 3 is a partially enlarged view of a region R1 in FIG. 2.
Figure 4:
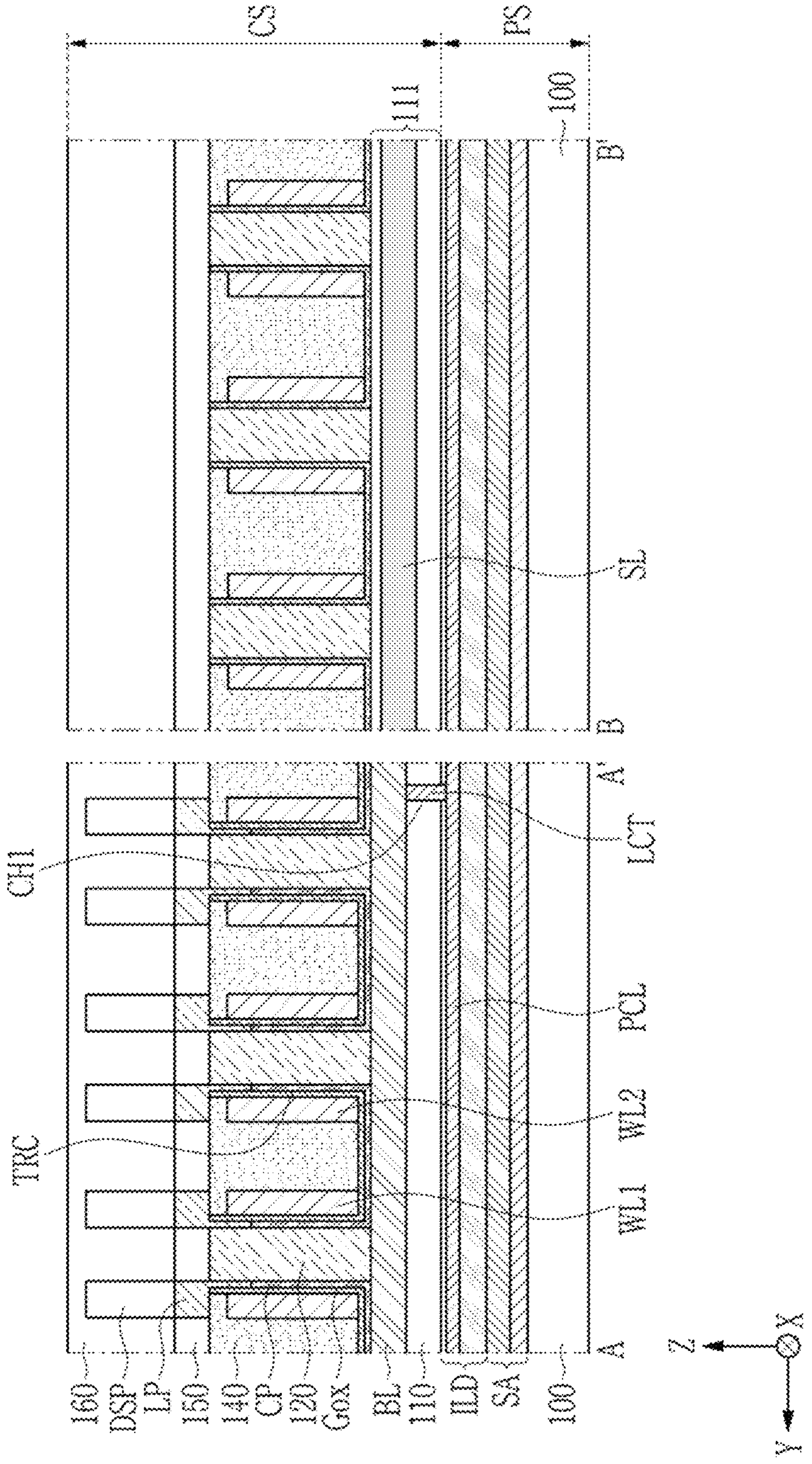
FIG. 4 is a cross-sectional view taken along lines A-A' and B-B' of FIG. 2.
Figure 5A:
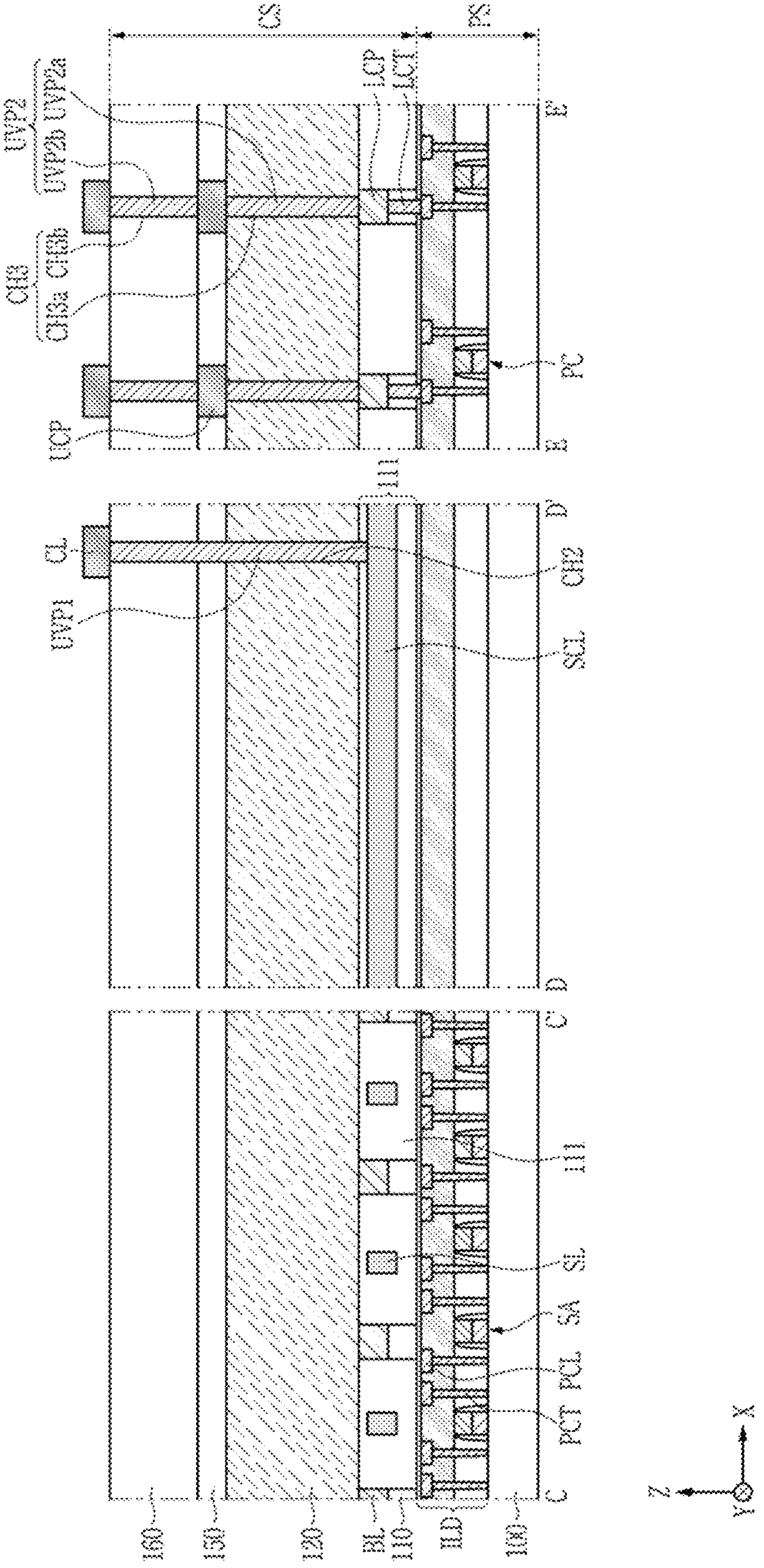
FIG. 5A and FIG. 5B are cross-sectional views taken along lines C-C', D-D', and E-E' of FIG. 2 according to one or more embodiments.
Figure 5B:
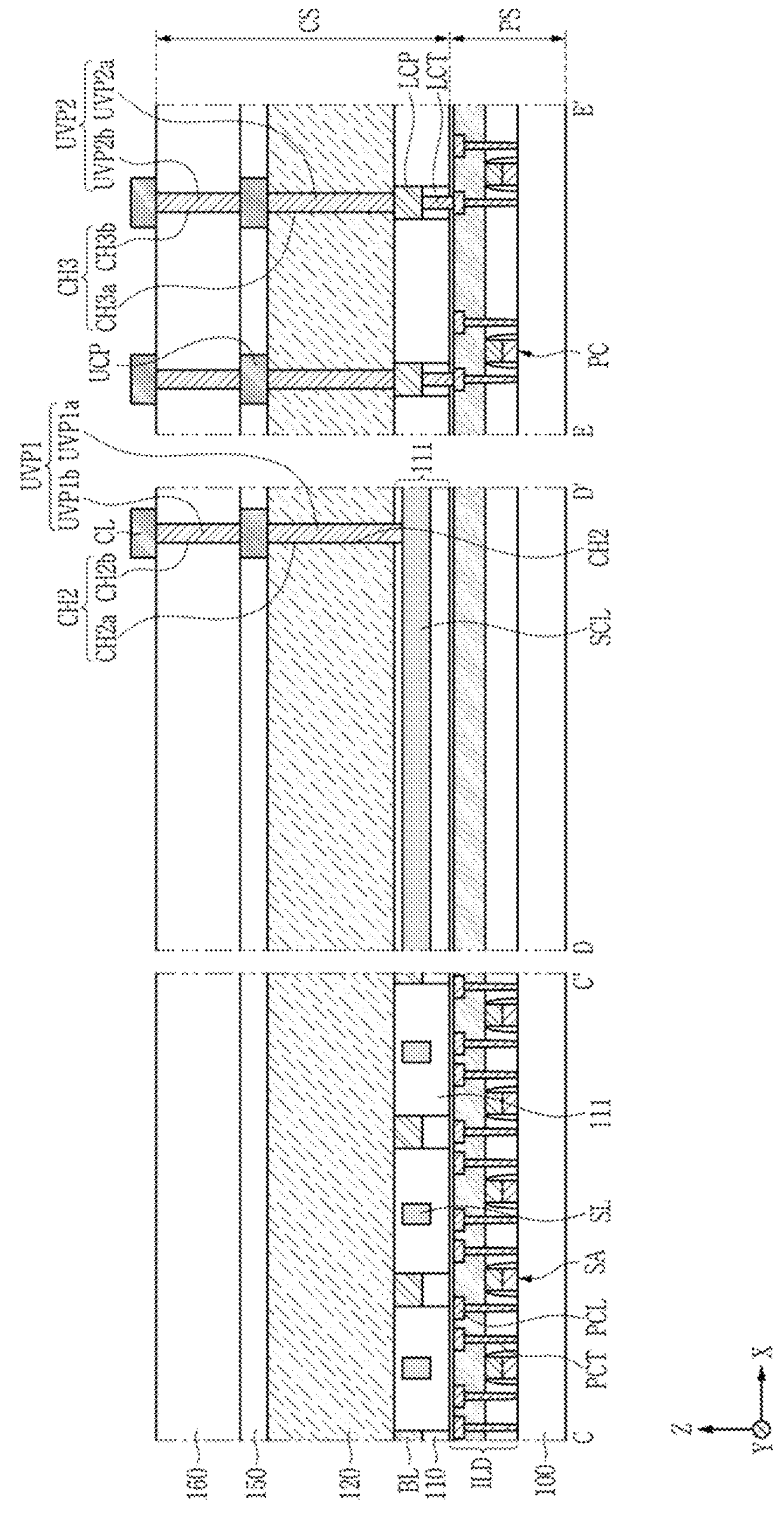

FIG. 1 is a perspective view schematically showing a semiconductor memory device according to an embodiment. FIG. 2 is a top plan view schematically showing a semiconductor device according to an embodiment. FIG. 3 is a partially enlarged view of a region R1 in FIG. 2. FIG. 4 is a cross-sectional view taken along lines A-A' and B-B' of FIG. 2. FIG. 5A and FIG. 5B are cross-sectional views taken along lines C-C', D-D', and E-E' of FIG. 2 according to one or more embodiments.

Referring to FIG. 1 to FIG. 5B, a semiconductor device 10 according to an embodiment may include a peripheral circuit structure PS a substrate 100 and a cell array structure CS. The peripheral circuit structure PS may be positioned on the substrate 100. The cell array structure CS may be positioned on the peripheral circuit structure PS.

The substrate 100 according to an embodiment may include a cell array region CAR and a peripheral region ER. The peripheral region ER may surround the cell array region CAR on a plane extending in a first direction X and a second direction Y.

The peripheral region ER may include a peripheral circuit region PCR. The peripheral circuit region PCR may be positioned apart from the cell array region CAR in the first direction X on a plane. However, the present disclosure is not limited thereto, and in some embodiments, the substrate 100 may further include other regions, and some regions may be omitted. For example, the peripheral circuit region PCR positioned in the peripheral region ER may be omitted.

The peripheral circuit structure PS may include core circuits SA and peripheral circuits PC positioned on the substrate 100.

The peripheral circuit structure PS may be positioned between the substrate 100 and the cell array structure CS in a third direction Z, which may be vertical with respect to the upper surface of the substrate 100. Similarly, the third direction Z may be vertical with respect to a plane extending in the first direction X and the second direction Y. For example, the core circuit SA may be positioned in the cell array region CAR of the substrate 100, and the peripheral circuit PC may be positioned in the peripheral circuit region PCR of the substrate 100. The spatial relationship between the core and peripheral circuits SA and PC included in the peripheral circuit structure PS, the peripheral circuit structure PS, and the cell array structure CS is not limited thereto and may be variously changed.

The cell array structure CS may include bit lines BL, word lines WL, and memory cells MC positioned between the bit lines BL and the word lines WL. The memory cells MC may be arranged two-dimensionally on a plane extending in the first direction X and the second direction Y. The memory cells MC may be arranged three-dimensionally on the plane extending in the first direction X and the second direction Y.

Each of the memory cells MC may include a selection element TR and a data storage element DS. The selection element TR and the data storage element DS may be electrically coupled in series. The selection element TR may be connected between the data storage element DS and the word line WL. The data storage element DS may be connected to the bit line BL through the selection element TR. The selection element TR may be a field effect transistor (FET). The data storage element DS may be implemented as a capacitor, a magnetic tunnel junction pattern, or a variable resistor.

The selection element TR may include a transistor, a gate electrode, and drain/source terminals. The gate electrode of the transistor may be connected to the word line WL. The drain/source terminals of the transistor may be connected to the bit line BL and the data storage element DS, respectively.

In an embodiment, a vertical channel transistor (VCT) may be included as a selection element TR of each memory cell MC. The vertical channel transistor may refer to a structure in which a channel length extends in the third direction Z, vertical with respect to the upper surface of the substrate 100. In addition, a capacitor may be provided as the data storage element DS of each memory cell MC.

Specifically, the substrate 100 may be a silicon substrate, a gallium arsenic substrate, a silicon germanium substrate, or a semiconductor on insulator (SOI) substrate. However, the material included in the substrate 100 is not limited thereto and may be variously changed. Hereinafter, the substrate 100 will be described as a silicon substrate.

The peripheral circuit structure PS may include core circuits SA and peripheral circuits PC, a peripheral circuit insulation layer ILD, peripheral circuit contact plugs PCT, and peripheral circuit wirings PCL. The core circuits SA and peripheral circuits PC may be respectively positioned in the cell array region (CAR) and the peripheral circuit region PCR of the substrate 100. The peripheral circuit insulation layer ILD may cover the core and peripheral circuits SA and PC.

The core and peripheral circuits SA and PC may include NMOS and PMOS transistors integrated on the substrate 100. The core and peripheral circuits SA and PC may be electrically connected to the bit lines BL and the word lines WL through the peripheral circuit wirings PCL and the peripheral circuit contact plugs PCT.

The peripheral circuit insulation layer ILD may be positioned on the substrate 100. The peripheral circuit insulation layer ILD may cover the core and peripheral circuits SA and PC, the peripheral circuit wirings PCL, and the peripheral circuit contact plugs PCT. The peripheral circuit insulation layer ILD may have a substantially flat upper surface.

The peripheral circuit insulation layer ILD may include multi-layered insulation layers. For example, the peripheral circuit insulation layer ILD may include a silicon oxide layer, a silicon nitride layer, a silicon oxynitride layer, and/or a low dielectric layer. However, the peripheral circuit insulation layer ILD is not limited thereto, and the composition and material of the peripheral circuit insulation layer ILD may be variously changed.

The cell array structure CS may be positioned on the peripheral circuit insulation layer ILD. The cell array structure CS may include a plurality of bit lines BL, a plurality of shielding lines SL, a shielding contact line SCL, a first insulation layer 110, a second insulation layer 111, a third insulation layer 150, and a fourth insulation layer 160, a first insulation pattern 120 and second insulation pattern 140, a channel pattern CP, first and second word lines WL1 and WL2, a gate insulation pattern Gox, a landing pad LP, and data storage patterns DSP.

The bit line BL may be positioned on the substrate 100. For example, the first insulation layer 110 may be positioned on the substrate 100, and the bit line BL may be positioned on the first insulation layer 110. The first insulation layer 110 may be positioned between the bit lines BL and the peripheral circuit wirings PCL and between the lower conductive pads LCP and the peripheral circuit wirings PCL. The first insulation layer 110 may surround the lower contact plugs LCT.

The first insulation layer 110 may include a silicon oxide layer, a silicon nitride layer, a silicon oxynitride layer, and/or a low dielectric layer. However, the first insulation layer 110 is not limited thereto, and the material included in the first insulation layer 110 may be variously changed.

In an embodiment, the semiconductor device 10 may include a plurality of bit lines BL. Each of the plurality of bit lines BL may extend in the second direction Y in the cell array region CAR of the substrate 100. The plurality of bit lines BL may be positioned apart in the first direction X. Here, first and second directions X and Y may be parallel to the upper surface of the substrate 100.

The bit line BL may include a conductive material. For example, the bit line BL may include a doped polysilicon, a metal, a conductive metal nitride, a conductive metal silicide, a conductive metal oxide, or a combination thereof. The bit lines BL may be made of a doped polysilicon, Aluminum (Al), Copper (Cu), Titanium (Ti), Tantalum (Ta), Ruthenium (Ru), Tungsten (W), Molybdenum (Mo), Platinum (Pt), Nickel (Ni), Cobalt (Co), Titanium Nitride (TiN), Tantalum Nitride (TaN), Tungsten Nitride (WN), Niobium Nitride (NbN), Titanium Aluminum (TiAl), Titanium Aluminum Nitride (TiAlN), Titanium Silicide (TiSi), Titanium Silicide Nitride (TiSiN), Tantalum Silicide (TaSi), Tantalum Silicide Nitride (TaSiN), Ruthenium Titanium Nitride (RuTiN), Nickel Silicide (NiSi), Cobalt Silicide (CoSi), Iridium Oxide (IrOx), Ruthenium Oxide (RuOx), or a combination thereof, but is not limited thereto, and the material included in the bit line BL may be variously changed.

The bit line BL may include a single layer or multiple layers of the above materials. In some embodiments, the bit line BL may include two-dimensional and three-dimensional materials, for example, graphene of a carbon-based two-dimensional material, a carbon nanotube of a three-dimensional material, or a combination thereof.

A first contact hole CH1 may penetrate the first insulation layer 110 in the cell array region CAR. The bit lines BL may be connected to the peripheral circuit wirings PCL through the lower contact plugs LCT positioned in the first contact hole CH1 penetrating the first insulation layer 110 in the cell array region CAR.

FIG. 2 shows that the first contact hole CH1 may be positioned on an end portion of the bit lines BL. A lower contact plug LCT may be positioned in the first contact hole CH1. The lower contract plug LCT may connect the bit lines BL and the peripheral circuit wirings PCL. Positions of the first contact hole CH1 and the lower contact plug LCT for connecting the bit lines BL and the peripheral circuit wirings PCL are not limited thereto and may be variously changed.

In addition, the lower conductive pads LCP may be disposed at the substantially same level as the bit lines BL in the peripheral circuit region PCR. The lower conductive pads LCP may be connected to the peripheral circuit wirings PCL through the lower contact plugs LCT penetrating the first insulation layer 110. The lower conductive pads LCP may include the same conductive material as the bit lines BL.

A second insulation layer 111 may be positioned on the peripheral circuit insulation layer ILD. The second insulation layer 111 may be positioned between the bit lines BL. The second insulation layer 111 may be positioned between the bit lines BL. The second insulation layer 111 may surround the sides of the first insulation layer 110 and the bit lines BL. An upper surface of the bit lines BL may be exposed by the second insulation layer 111.

In an embodiment, the upper surface, the bottom surface, and the side surfaces of the shielding line SL may be surrounded by the second insulation layer 111. The shielding line SL may be positioned between the bit lines BL, and the shielding line SL may be positioned within the second insulation layer 111. The upper surface of the shielding line SL may be lower than an upper surface of the bit lines BL. That is, the shielding line SL may be buried in the second insulation layer 111.

The second insulation layer 111 may include, for example, a silicon oxide layer, a silicon nitride layer, a silicon oxynitride layer, and/or a low dielectric layer. However, the material included in the second insulation layer 111 is not limited thereto and may be variously changed.

The top surface of the shielding line SL may be positioned at the level between the top surface and the bottom surface of the bit line BL. In addition, the upper surface of the shielding line SL may be positioned at a level higher than the upper surface of the first insulation layer 110, and the bottom surface of the shielding line SL may be positioned at a level between the upper surface and the bottom surface of the first insulation layer 110. However, the spatial relationship between the shielding line SL and the bit line BL and the spatial relationship between the shielding line SL and the first insulation layer 110 are not limited thereto and may be variously changed.

In an embodiment, the semiconductor device 10 may include a plurality of shielding lines SL. The plurality of shielding lines SL may be positioned between the bit lines BL. The plurality of shielding lines SL may extend in the second direction Y. The plurality of shielding lines SL may be arranged to be spaced apart in the first direction X. The plurality of shielding lines SL and the plurality of bit lines BL may respectively extend side-by-side along the second direction Y and may be alternately arranged along the first direction X. For example, the plurality of shielding lines SL may be positioned alternately with the plurality of bit lines BL.

Also, in an embodiment, the shielding lines SL may be disposed at a center portion between the bit lines BL. That is, a separation distance from the shielding line SL to the bit line BL positioned on a first side of first direction X may be substantially the same as the distance from the shielding line SL to the bit line BL positioned on a second side of the first direction X. However, the spatial relationship between the bit lines BL and the shielding line SL is not limited thereto and may be variously changed.

For example, the shielding line SL positioned between the bit lines BL may be positioned closer toward one of the bit line BLs positioned on the sides of the shielding line SL.

In an embodiment, a length along the second direction Y of each of the shielding lines SL may be longer than a length along the second direction Y of each of the bit lines BL. That is, unlike the bit lines BL positioned in the cell array region CAR, each of the plurality of shielding lines SL may extend in the second direction Y from the cell array region CAR toward the peripheral region ER. That is, the plurality of shielding lines SL may extend along the second direction Y from the cell array region CAR to reach the peripheral region ER.

In an embodiment, a portion of each of the shielding lines SL may be positioned in the cell array region CAR and a remaining portion may be positioned in the peripheral region ER. However, the lengths of the shielding lines SL and the bit lines BL along the second direction Y are not limited thereto and may be variously changed.

The shielding lines SL may include a conductive material. For example, the shielding line SL may include a metal material such as tungsten (W), titanium (Ti), nickel (Ni), cobalt (Co), or a combination thereof. In some embodiments, the shielding line SL may include two-dimensional and three-dimensional materials, for example, graphene of a carbon-based two-dimensional material, a carbon nanotube of a three-dimensional material, or a combination thereof.

In an embodiment, the bit line BL and the shielding line SL may include different materials. For example, the bit line BL includes any one of doped polysilicon, aluminum (Al), or copper (cu), and the shielding line SL may include any one of tungsten (W), titanium (Ti), nickel (Ni), or cobalt (Co)

However, the present disclosure is not limited thereto, and in some embodiments, the bit line BL and the shielding line SL may include the same material.

The shielding line SL may be positioned in the peripheral region ER of the substrate 100. The shielding line SL may be connected to the shielding contact line SCL extending in the first direction X. Each of the plurality of shielding lines SL may extend in the second direction Y from the cell array region CAR of the substrate 100 toward the peripheral region ER, and an end portion of each of the plurality of shielding lines SL positioned in the peripheral region ER of the substrate 100 may be connected to the shielding contact line SCL positioned in the peripheral region ER of the substrate 100.

As the shielding contact line SCL may be positioned in the peripheral region ER of the substrate 100, the shielding contact line SCL may be spaced apart from the cell array region CAR along the second direction Y. That is, the shielding line SL extending in the second direction Y may be positioned between the cell array region CAR and the shielding contact line SCL on a plane.

The plurality of shielding lines SL may reduce a coupling capacitance due to a mutual interference between the bit lines BL positioned adjacent to each other. The shielding contact line SCL may be connected to a wiring for applying a voltage to the shielding line SL. A voltage may be applied from the wiring to each of a plurality of shielding lines SL connected to the shielding contact line SCL. That is, each of the plurality of shielding lines SL may be connected to a wiring or a circuit for applying a voltage to each of the shielding lines SL through the shielding contact line SCL.

In an embodiment, the shielding contact line SCL may be connected to a wiring for applying a voltage to the shielding line SL through the second contact hole CH2 positioned in the peripheral region ER of the substrate 100. However, the number of positions and contact holes on which the shielding contact line SCL and the wiring for applying the voltage to the shielding line SL are connected are not limited thereto and may be variously changed.

FIG. 2 shows that the shielding contact line SCL may be positioned on only one side of the second direction Y of the cell array region CAR, but the position and number of the shielding contact lines are not limited thereto and may be variously changed.

In an embodiment, the shielding line SL and the shielding contact line SCL may be formed as an integral unit. That is, the shielding line SL and the shielding contact line SCL may be formed simultaneously by the same process, thereby being integrally configured. However, the shielding line SL and the shielding contact line SCL are not limited thereto, and in some embodiments, the shielding line SL and the shielding contact line SCL may be formed by separate processes and may be formed separate configurations.

The shielding contact line SCL may be positioned on the substantially same level as the shielding line SL. That is, the shielding contact line SCL may be positioned within the second insulation layer 111. In an embodiment, the upper surface of the shielding contact line SCL may be positioned on a level between the upper surface and the bottom surface of the bit line BL. In addition, the upper surface, the bottom surface, and the side surfaces of the shielding contact line SCL may be surrounded by the second insulation layer 111. However, the spatial relationship between the shielding contact line SCL and the shielding line SL is not limited thereto and may be variously changed.

In an embodiment, the shielding contact line SCL may include the same material as the material included in the shielding line SL. However, the material included in the shielding contact line SCL is not limited thereto and may be variously changed. For example, as described above, when the shielding line SL and the shielding contact line SCL are formed by separate processes and consist of separate configurations, the shielding contact line SCL may include a material different from that of the shielding line SL.

The shielding line SL may have a first width W1, the bit line BL may have a second width W2, and the shielding contact line SCL may have a third width W3.

Here, the width means a width along with a direction perpendicular to the extension direction of each line. For example, the first width W1 of the shielding line SL and the second width W2 of the bit line BL may mean a width along the first direction X, and the third width W3 of the shielding contact line SCL may mean a width along the second direction Y.

In an embodiment, at least one of the first width W1, the second width W2, and the third width W3 may be different. For example, the first width W1 may be smaller than the second width W2 and the third width W3, and the second width W2 may be smaller than the third width W3. That is, the third width W3 may be the largest and the first width W1 may be the smallest.

That is, the width of the shielding line SL may be smaller than the width of the bit line BL and the width of the shielding contact line SCL, and the width of the bit line BL may be smaller than the width of the shielding contact line SCL. However, the relationship between the width of the bit line BL, the width of the shielding line SL, and the width of the shielding contact line SCL is not limited thereto and may be variously changed. For example, the first width W1 and the second width W2 may be substantially equal, and the third width W3 may be greater than the first width W1 and the second width W2.

The first insulation pattern 120 may be positioned on the bit lines BL and the second insulation layer 111. The first insulation pattern 120 may define trenches TRC that intersect the bit lines BL, extend in the first direction X, and are spaced apart from each other in the second direction Y. The first insulation pattern 120 may cover the upper surface of the lower conductive pads LCP in the peripheral circuit region PCR.

The first insulation pattern 120 may include, for example, at least one of silicon oxide, silicon oxynitride, silicon nitride, and low-k material having a smaller dielectric constant than silicon oxide, but is not limited thereto.

The low-k material, for example, may include at least among flowable oxide (FOX), torene silazene (TOSZ), undoped silicate glass (USG), borosilicate glass (BSG), phosphosilicate glass (PSG), noroPhosphosilicate glass (BPSG), plasma enhanced tetra-ethyl ortho Silicate (PE-TEOS), FSG (Fluoride silicate glass), CDO (Carbon Doped silicon Oxide), Xerogel, aerogel, amorphous fluorinated carbon, organo silicate glass (OSG), parylene, bis-benzocyclobutenes (BCB), SiLK, polyimide, porous polymeric material or combinations thereof, but the present disclosure is not limited thereto and may be variously changed.

The channel patterns CP may be disposed on the bit lines BL. The channel patterns CP may be spaced apart from each other in the second direction Y on each on the bit line BL. That is, the channel patterns CP may be spaced apart from each other along the first direction X and the second direction Y that intersect each other, thereby being arranged in a matrix form.

In addition, the channel patterns CP may non-overlap the shielding lines SL positioned between bit lines BL in the third direction Z vertical to the substrate. That is, channel patterns CP may non-overlap the shielding lines SL on a plane. In other words, the channel patterns CP may be positioned to be spaced in the first direction X with the shielding line SL interposed therebetween on a plane. However, the spatial relationship between the channel patterns CP and the shielding lines SL is not limited thereto and may be variously changed. For example, the channel patterns CP may overlap at least part of the shielding lines SL on a plane.

The channel pattern CP may include a first source/drain region and a second source/drain region. For example, the lower part of the channel pattern CP may function as the first source/drain region by being connected to the bit line BL, and the upper part of the channel pattern CP may function as the second source/drain region by being connected to the landing pad LP, the part of the channel pattern CP between the first source/drain region and the second source/drain region may function as a channel region.

In an embodiment, on a cross-section, the channel pattern CP may have a substantially "U" shape. Specifically, the channel pattern CP may be disposed on a sidewall of the trench TRC. The channel pattern CP may be extended along the profile of the trench TRC in the first direction X. The channel pattern CP may include a plurality of sections in the trench TRC. The sections of the channel pattern CP within the trench TRC may be positioned apart from each other in the first direction X. Channel patterns CP in different trenches TRC may be positioned apart from each other in the second direction Y. That is, the first insulation pattern 120 may be positioned between the channel patterns CP adjacent in the second direction Y.

Each of the channel patterns CP may include a horizontal part extending in the second direction Y and disposed on the bit line BL and vertical parts extending along third direction Z vertical to the substrate 100 from an end portion of the horizontal part and facing to each other in the second direction Y.

The channel pattern CP may include an oxide semiconductor material. For example, the oxide semiconductor material may include indium gallium zinc oxide (IGZO), indium gallium silicon oxide (IGSO), indium tin zinc oxide (ITZO), indium gallium tin oxide (IGTO), indium zinc oxide (IZO), zinc oxide (ZnO), zinc tin oxide (ZTO( ) zinc oxynitride (ZnON), zirconium zinc tin oxide (ZZTO), tin oxide (SnO), hafnium indium zinc oxide (HIZO), gallium zinc tin oxide (GZTO), aluminium zinc tin oxide (AZTO), ytterbium gallium zinc oxide (YGZO), indium gallium oxide (IGO) or combinations thereof. However, the oxide semiconductor material is not limited thereto and may be variously changed.

In some embodiments, the channel pattern CP may include a single layer or multiple layers of the oxide semiconductor materials described above. In some embodiments, the channel pattern CP may include a two-dimensional semiconductor material. The two-dimensional semiconductor material may include, for example, graphene, carbon nanotube, or a combination thereof.

The word lines WL1 and WL2 may intersect the bit lines BL and the shielding lines SL, extend in the first direction X, and be spaced apart along the second direction Y. A pair of word lines WL1 and WL2 may be positioned on the channel pattern CP in the trench TRC.

Specifically, each of the word lines WL1 and WL2 includes one surface and the other surface opposite to the one surface, and one surfaces of the word lines WL1 and WL2 may be disposed to face each other on the channel pattern CP.

One surface of the word lines WL1 and WL2 may be in contact with a second insulation pattern 140, and the other surface may be in contact with a gate insulation pattern Gox.

The word lines WL1 and WL2 may include the upper and bottom surfaces facing each other in the third direction Z. The upper surfaces of the word lines WL1 and WL2 may be in contact with a second insulation pattern 140, and may face the landing pad LP with the second insulation pattern 140 interposed therebetween.

In an embodiment, the upper surface of the word lines WL1 and WL2 may be positioned at a level higher than the upper surface of the channel pattern CP and positioned at a level lower than the upper surface of the first insulation pattern 120. However, the spatial relationship between the upper surface of word lines WL1 and WL2, the upper surface of channel pattern CP, and the upper surface of first insulation pattern 120 is not limited thereto and may be variously changed.

The bottom surfaces of the word lines WL1 and WL2 may be in contact with a gate insulation pattern Gox, described herein, and may face the bit line BL with the gate insulation pattern Gox and the channel pattern CP interposed therebetween.

The word lines WL1 and WL2 may include a conductive material. For example, the word lines WL1 and WL2 may include a doped polysilicon, a metal, a conductive metal nitride, a conductive metal silicide, a conductive metal oxide, or a combination thereof.

As another example, the word lines WL1 and WL2 may be formed of Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto, and the materials included in word lines WL1 and WL2 may be variously changed.

The word lines WL1 and WL2 may include a single layer or multiple layers of the above materials. In some embodiments, the word lines WL1 and WL2 may include a two-dimensional semiconductor material, for example, the two-dimensional semiconductor material may include graphene, carbon nanotube, or a combination thereof.

In an embodiment, the gate insulation pattern Gox may have a "U" shape on the cross-section. For example, the gate insulation pattern Gox may be positioned between the channel patterns CP and the word lines WL1 and WL2. The gate insulation pattern Gox may be conformally positioned on the surface of the channel pattern CP within the trench TRC.

The gate insulation pattern Gox may conformally cover the surfaces of the word lines WL1 and WL2. That is, the gate insulation pattern Gox may be positioned between the bottom surface of the word lines WL1 and WL2 and the horizontal part of the channel patterns CP, and between the other surface of the word lines WL1 and WL2 and the vertical part of the channel pattern CP, and may cover the bottom surface of the word lines WL1 and WL2.

In addition, the gate insulation pattern Gox may be positioned between the word lines WL1 and WL2 and the first insulation pattern 120.

The upper surface of the gate insulation pattern Gox may be positioned at a level higher than the upper surface of the channel pattern CP and the upper surface of the word lines WL1 and WL2, and may be positioned at the substantially same level as the upper surface of the first insulation pattern 120. However, the spatial relation of the upper surface of the channel pattern CP, the upper surface of the word lines WL1 and WL2, and the upper surface of the first insulation pattern 120, and the upper surface the of the gate insulation pattern Gox is not limited thereto and may be variously changed.

The gate insulation pattern Gox may be formed of a silicon oxide layer, a silicon oxynitride layer, a high dielectric layer having a higher dielectric constant than the silicon oxide layer, or a combination thereof. The high dielectric layer may be made of metal oxide or metal oxynitride. For example, the high dielectric layer usable as a gate insulation layer may be made of HfO2, HfSiO, HfSiON, HfTaO, HfTiO, HfZrO, ZrO2, Al2O3, or a combination thereof, but is not limited thereto, and the material included in the gate insulation pattern Gox may be variously changed.

The second insulation pattern 140 may be positioned within the trench TRC. The second insulation pattern 140 may fill the remaining trench TRC region after the channel pattern CP, the gate insulation pattern Gox, and the word lines WL1 and WL2 are formed. The second insulation pattern 140 may be positioned on the upper surface and the side surface of the word lines WL1 and WL2, and may extend in the second direction Y and the third direction Z. In an embodiment, the second insulation pattern 140 may have a substantially "T" shape on a cross-section. However, the shape of the second insulation pattern 140 on a cross-section is not limited thereto and may be variously modified.

In some embodiments, the gate insulation pattern Gox may be further positioned between the word lines WL1 and WL2 and the second insulation pattern 140. That is, the gate insulation pattern Gox may be positioned between the word lines WL1 and WL2 and the second insulation pattern 140, and may be conformally positioned along the upper surface and one surface of the word lines WL1 and WL2.

The upper surface of the second insulation pattern 140 may be positioned on the substantially same level as the upper surface of the first insulation pattern 120 and the upper surface of the gate insulation pattern Gox. The upper surface of the second insulation pattern 140 may be positioned at a higher level than the upper surface of the channel pattern CP and the upper surface of word lines WL1 and WL2. However, the present disclosure is not limited thereto, and the spatial relationship of the upper surface of the first insulation pattern 120, the upper surface of gate insulation pattern Gox, the upper surface of channel pattern CP, and the upper surface of word lines WL1 and WL2 and the upper surface of the second insulation pattern 140 may be changed in various ways.

The second insulation pattern 140 may include, for example, at least one of silicon oxide, silicon oxynitride, silicon nitride, and low dielectric constant (low-k) material having a smaller dielectric constant than silicon oxide, however the present disclosure is not limited, and the material included in the second insulation pattern 140 may be variously changed.

The landing pads LP may be positioned to overlap at least part of the channel pattern CP in the third direction Z, which may be the direction vertical to the substrate 100.

The semiconductor device 10 according to an embodiment may include a plurality of landing pads LP. The plurality of landing pads LP may be spaced apart from each other in the first direction X and the second direction Y, thereby being arranged in a matrix form. However, this is an example, and the plurality of landing pads LP connected to the channel pattern CP may be arranged in various other shapes such as a honeycomb shape.

In FIG. 2, the landing pads LP are illustrated as having a circular shape on a plane, but the present disclosure is not limited thereto, and the shape of the landing pads LP on a plane may be variously changed. For example, the shape on a plane of the landing pads LP can have various shapes such as an oval, a rectangle, a square, a rhombus, or a hexagon.

The landing pads LP may in directly contact with the channel patterns CP and connected to the vertical part of the channel patterns CP.

The part of the landing pads LP may be positioned at a level higher than the upper surface of the first insulation pattern 120, the upper surface of the second insulation pattern 140, and the upper surface of the gate insulation pattern Gox, and the remaining part may be positioned at a level lower than the upper surface of the first insulation pattern 120, the upper surface of the second insulation pattern 140, and the upper surface of the gate insulation pattern Gox.

In detail, the landing pads LP may include a first portion extending in the second direction Y and a second portion extending from the first portion in the third direction Z.

The first portion of the landing pad LP may be positioned at a level higher than the upper surface of the first insulation pattern 120, the upper surface of the second insulation pattern 140, and the upper surface of the gate insulation pattern Gox.

The second portion of the landing pad LP may be positioned at a lower level than the upper surface of the first insulation pattern 120, the upper surface of the second insulation pattern 140, and the upper surface of the gate insulation pattern Gox, and directly in contact with the upper surface of the channel pattern CP.

FIG. 4 shows that the bottom surface of the first portion of the landing pad LP may be positioned on substantially the same level as the upper surface of the first insulation pattern 120 and the upper surface of the second insulation pattern 140, however the present disclosure is not limited thereto. In some embodiments, the bottom surface of the first portion of the landing pad LP may be positioned at a lower level than the upper surface of the first insulation pattern 120 and the upper surface of the second insulation pattern 140.

One side of the second portion of the landing pad LP may be in contact with the first insulation pattern 120, and the other side of the second portion of the landing pad LP may be in contact with the gate insulation pattern Gox.

The bottom surface of the second portion of the landing pad LP may be positioned at a lower level than the upper surface of the word lines WL1 and WL2. However, the spatial relationship between the bottom surface of the second portion of the landing pad LP and the upper surface of the word lines WL1 and WL2 is not limited thereto and may be variously changed. For example, the bottom surface of the second portion of the landing pad LP may be positioned at the substantially same level as the upper surface of word lines WL1 and WL2, or positioned at a level higher than the upper surface of the word lines WL1 and WL2.

The landing pads LP may include a conductive material. For example, the landing pads LP may include doped polysilicon, metal, conductive metal nitride, conductive metal silicide, conductive metal oxide, or a combination thereof.

As another example, the landing pads LP may include Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof, but is not limited thereto and may be variously changed.

The third insulation layer 150 may be positioned above the first insulation pattern 120 and the second insulation pattern 140, and may fill the space between the landing pads LP spaced apart in the second direction Y. That is, the landing pads LP may be separated and insulated from each other by the third insulation layer 150.

The bottom surface of the third insulation layer 150 may be positioned at the substantially same level as the bottom surface of the first portion of the landing pads LP. However, the present disclosure is not limited thereto, and in some embodiments, the bottom surface of the third insulation layer 150 may be positioned at a different level from the bottom surface of the first portion of the landing pads LP.

The third insulation layer 150 may include the same material as the first insulation layer 110 and the second insulation layer 111 described herein. However, the present disclosure is not limited thereto, and the material included in the third insulation layer 150 may be variously changed.

The data storage patterns DSP may be positioned on the landing pads LP, respectively. The data storage patterns DSP may be respectively electrically connected to the channel pattern CP via the landing pads LP.

The data storage patterns DSP may be arranged in a matrix form along the first direction X and the second direction Y as shown in FIG. 1. However, this is an example, and the data storage pattern DSP connected to the landing pad LP may have various arrangements on a plane.

In an embodiment, the data storage patterns DSP may be a capacitor and may include lower and upper electrodes and a capacitor dielectric layer interposed between lower and upper electrodes. When the data storage patterns DSP has the above structure, the lower electrode may be in contact with the landing pad LP, and the lower electrode can have various shapes such as circular, elliptical, rectangle, square, rhombus, or hexagonal shapes on a plane.

In contrast, the data storage patterns DSP may be a variable resistor pattern that may be switched with two resistance states by an electrical pulse applied to a memory element. For example, the data storage patterns DSP may include phase-change materials of which a crystalline state changes according to an amount of current, perovskite compounds, transition metal oxides, magnetic materials, ferromagnetic materials, or antiferromagnetic materials.

A fourth insulation layer 160 may be positioned on the third insulation layer 150. The fourth insulation layer 160 may cover the data storage patterns DSP in the cell array region CAR. That is, the fourth insulation layer 160 may cover the upper surface and the side surfaces of the data storage pattern DSP.

The fourth insulation layer 160 may include the same material as the third insulation layer 150. However, the present disclosure is not limited thereto, and the material included in the fourth insulation layer 160 may be variously changed.

Connection lines CL may be positioned above the fourth insulation layer 160 in the peripheral region ER and the peripheral circuit region PCR of the substrate 100. The connection lines CL may be a first conductive pattern.

In detail, as shown in FIG. 2, FIG. 5A, and FIG. 5B, in the peripheral region ER, the connection line CL may be connected to the shielding contact line SCL. The connection line CL may be connected to the shielding contact line SCL by the second contact hole CH2 positioned in the peripheral region ER. That is, the second contact hole CH2 may sequentially pass through the fourth insulation layer 160, the third insulation layer 150, and the first insulation pattern 120 to expose the upper surface of the shielding contact line SCL positioned within the second insulation layer 111.

In the second contact hole CH2, a first conductive via UVP1 that electrically connects the connection line CL and the shielding contact line SCL may be positioned. That is, the first conductive via UVP1 electrically connecting the connection line CL and the shielding contact line SCL may be positioned on the shielding contact line SCL.

The first conductive via UVP1 may include at least one metal among aluminum, copper, tungsten, molybdenum and cobalt, but is not limited thereto and may be variously changed.

In FIG. 5A, the first conductive via UVP1 may be directly connected to the shielding contact line SCL and the connection line CL, but the connection relationship between the shielding contact line SCL and the connection line CL is not limited thereto and may be variously changed. For example, as shown in FIG. 5B, the first conductive via UVP1 may connect the shielding contact line SCL and the connection line CL through the upper conductive pad UCP.

Specifically, the second contact hole CH2 positioned in the peripheral region ER of the substrate 100 may include a second lower contact hole CH2*a* penetrating the first insulation pattern 120 and exposing the upper surface of the shielding contact line SCL positioned in the second insulation layer 111 and a second upper contact hole CH2*b* penetrating the fourth insulation layer 160 and exposing the upper surface of the upper conductive pad UCP positioned within the third insulation layer 150.

The upper conductive pad UCP may be positioned on the first insulation pattern 120 and be positioned within the third insulation layer 150. The upper conductive pad UCP may include the same conductive material as the landing pads LP.

In addition, first conductive via UVP1 may include a first lower conductive via UVP1*a* and a first upper conductive via UVP1*b*.

The first lower conductive via UVP1*a* may be positioned within the second lower contact hole CH2*a*, and connect the shielding contact line SCL and the upper conductive pad UCP. The first upper conductive via UVP1*b* may be positioned within the second upper contact hole CH2*b*, and connect the upper conductive pad UCP and the connection line CL.

In an embodiment, the shielding contact line SCL may be electrically connected to the connection line CL.

In the peripheral circuit region PCR of the substrate 100, the lower conductive pads LCP may be connected to the connection lines CL positioned on the fourth insulation layer 160 through the second conductive via UVP2.

In detail, the third contact holes CH3 positioned in the peripheral circuit region PCR of the substrate 100 may include a third lower contact hole CH3*a* penetrating the first insulation pattern 120 and espousing the upper surface of the lower conductive pads LCP positioned on the first insulation layer 110 and a third upper contact hole CH3*b* penetrating the and fourth insulation layer 160 and exposing the upper surface of the upper conductive pad UCP positioned in the third insulation layer 150.

Also, the second conductive vias UV2 may include second lower conductive vias UVP2*a* and second upper conductive vias UVP2*b*.

The second lower conductive vias UVP2*a* may be positioned within the third lower contact hole CH3*a*, and connect the lower conductive pads LCP and the upper conductive pad UCP. The second upper conductive vias UVP2*b* may be positioned within the third upper contact hole CH3*b* and connect the upper conductive pad UCPs and the connection lines CL. In an embodiment, the lower conductive pads LCP may be electrically connected to the connection lines CL.

The second conductive vias UV2 may include the same material as the first conductive via UVP1 described above. However, the present disclosure is not limited thereto, and in some embodiments, the second conductive vias UV2 may include a material different from that of the first conductive vias UVP1.

According to the semiconductor device 10 according to an embodiment, the shielding lines SL may be positioned in the peripheral region ER of the substrate 100 may be electrically connected to a wiring or a circuit applying a voltage to the shielding lines SL though the shielding contact line SCL connected to the shielding lines SL.

The shielding contact lines SCL positioned in the peripheral region ER of the substrate 100 and connected to the shielding lines SL may be formed to have a relatively wide width compared to the shielding lines SL formed in the cell array region CAR of the substrate 100.

In an embodiment, when connecting the wiring for applying the voltage to the shielding lines SL and the shielding contact line SCL through the conductive vias, a wide contact area of the conductive vias and the shielding contact line SCL may be secured.

Therefore, in the process of forming the conductive vias to electrically connect the wiring that applies the voltage to the shielding line SL and the shielding contact line SCL, the contact area between the wirings may be prevented from decreasing due to a misalignment, thereby reducing defects of the semiconductor device 10.

Referring to FIG. 6, FIG. 7, FIG. 8, FIG. 9, FIG. 10A, FIG. 10B, and FIG. 10C. In the following embodiment, the same reference numerals refer to the same configuration as the previously described embodiment, and redundant descriptions may be omitted or simplified, and the differences will be mainly described.

Figure 6:
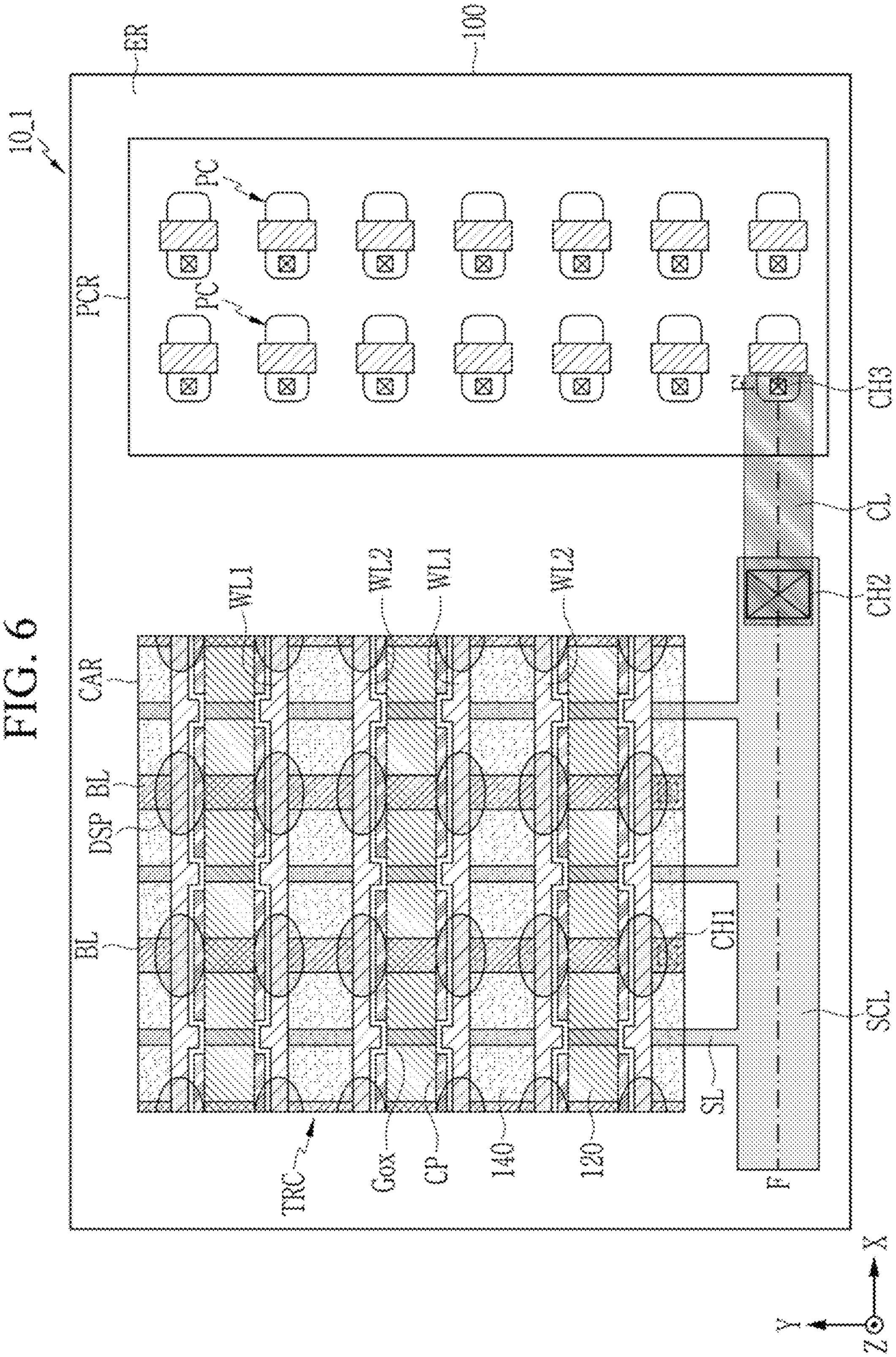
FIG. 6 is a top plan view schematically illustrating a semiconductor device according to another embodiment.
Figure 7:
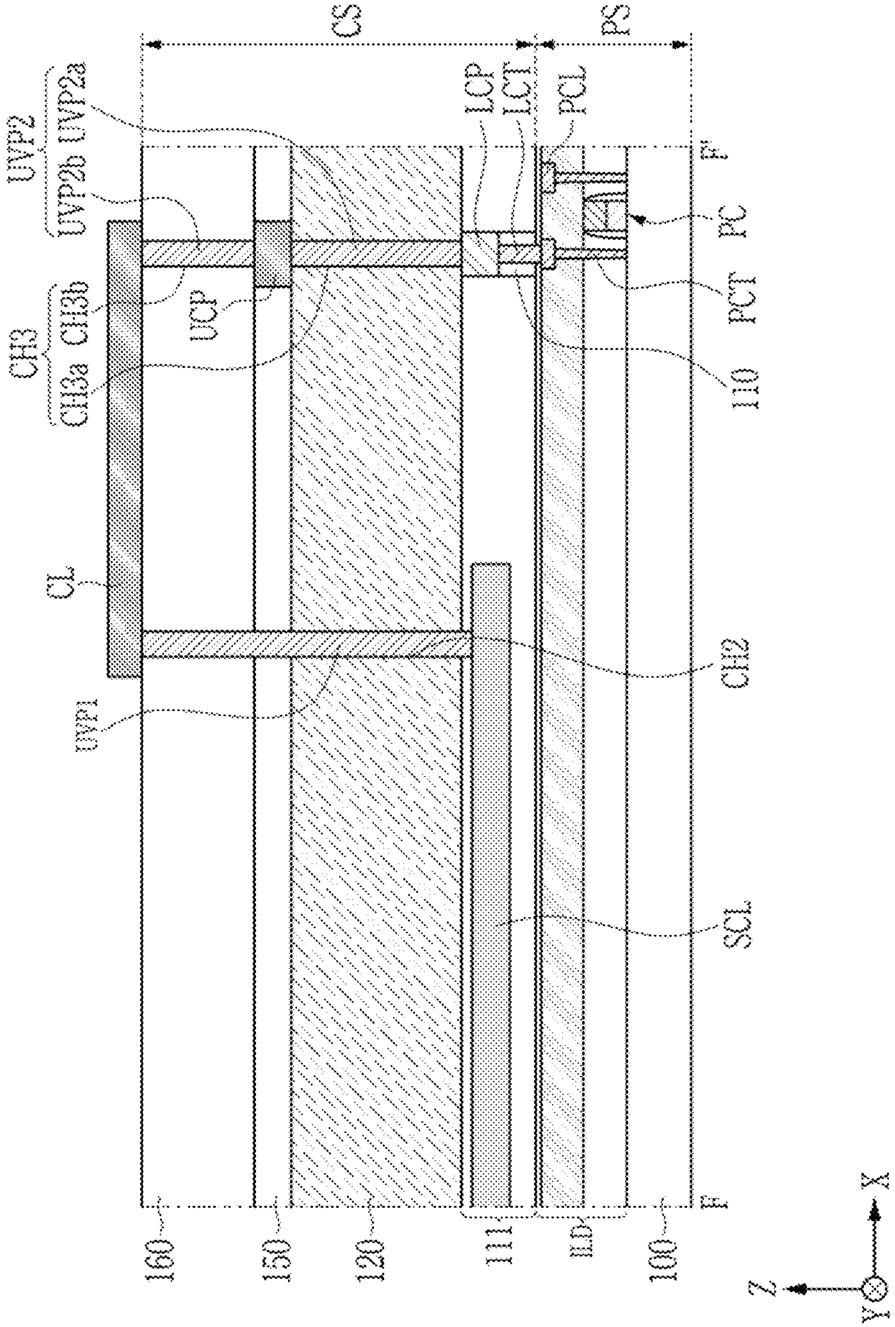
FIG. 7 is a cross-sectional view taken along a line F-F' of FIG. 6 according to another embodiment.

FIG. 6 is a top plan view schematically illustrating a semiconductor device according to another embodiment. FIG. 7 is a cross-sectional view cut along F-F' of FIG. 6 according to another embodiment.

Specifically, FIG. 6 and FIG. 7 are drawings to show the connection relationship between the shielding contact line SCL positioned in the peripheral region ER of the substrate 100 and the peripheral circuit PC positioned in the peripheral circuit region PCR of the substrate 100.

According to the semiconductor device 10_1 shown in FIG. 6 and FIG. 7, the shielding contact line SCL positioned in the peripheral region ER of the substrate 100 may be electrically connected to the peripheral circuit region PCR by a connection line CL extending in the first direction X from an end portion of the shielding contact line SCL toward the peripheral circuit region PCR.

That is, the shielding contact line SCL may be connected to the connection line CL through the second contact hole CH2 positioned on the substrate 100, and the connection line CL may be connected to one of the peripheral circuit PC through the third contact hole CH3 positioned on the peripheral circuit region PCR.

In detail, in the peripheral region of the substrate 100, the shielding contact line SCL and the connection line CL may be electrically connected by the first conductive via UVP1 positioned in the second contact hole CH2 above described.

In the peripheral circuit region PCR of the substrate 100, the connection line CL may be connected to the upper conductive pad UCP by the second upper conductive via UVP2*b*, and the upper conductive pad UCP may be connected to the lower conductive pad LCP by the second lower conductive via UVP2*a*.

The lower conductive pad LCP may be connected to the peripheral circuit PC by the lower contact plug LCT. Here, the peripheral circuit PC may be a circuit for applying a voltage to the shielding line SL.

In an embodiment, the peripheral circuit PC may be connected to the shielding contact line SCL through the connection line CL and apply a voltage to the shielding line SL through the shielding contact line SCL. However, the connection relationship between the connection line CL and the peripheral circuit PC in the peripheral circuit region PCR of the substrate 100 is not limited thereto and may be variously changed.

For example, the third contact hole CH3 may sequentially penetrate the fourth insulation layer 160, the third insulation layer 150, the first insulation pattern 120, and the second insulation layer 111, and expose the peripheral circuit PC positioned in the peripheral circuit insulation layer ILD. The second conductive via UVP2 may be formed integrally and positioned within the third contact hole CH3.

In an embodiment, the second conductive via UVP2 may directly connect the connection line CL and the peripheral circuit PC.

FIG. 7 shows that the shielding contact line SCL positioned on the peripheral region ER of the substrate 100 may be connected to the peripheral circuit PC positioned in the peripheral circuit region PCR by the connection line CL positioned on the fourth insulation layer 160, but the present disclosure is not limited thereto.

For example, the shielding contact line SCL may be electrically connected to other conductive patterns positioned at a level higher or lower than the connection line CL positioned on the upper surface of the fourth insulation layer 160, thereby being connected to the peripheral circuit PC positioned in the peripheral circuit region PCR.

Also, FIG. 7 shows that the shielding contact line SCL may be electrically connected to the connection line CL by the second contact hole CH2 positioned on the shielding contact line SCL, but the present disclosure is not limited thereto.

For example, the shielding contact line SCL may be electrically connected to conductive patterns positioned at a lower level than the shielding contact line SCL through a contact hole positioned below the shielding contact line SCL.

Also, in some embodiments, the shielding contact line SCL positioned in the peripheral region ER of the substrate 100 may be electrically connected to a circuit other than the peripheral circuit PC positioned in the peripheral circuit region PCR.

For example, the shielding contact line SCL may be electrically connected to a circuit that positioned in the peripheral region ER of the substrate 100 and applies a voltage to the shielding line SL through the connection line CL other than the core circuit SA positioned in the cell array region CAR of the substrate 100 or the peripheral circuit PC positioned in the peripheral region ER.

FIG. 8 to FIG. 10C are plan views schematically illustrating a semiconductor device according to some embodiments. Hereinafter a semiconductor device according to some embodiments is described further with reference to FIG. 8 to FIG. 10C.

Figure 8:
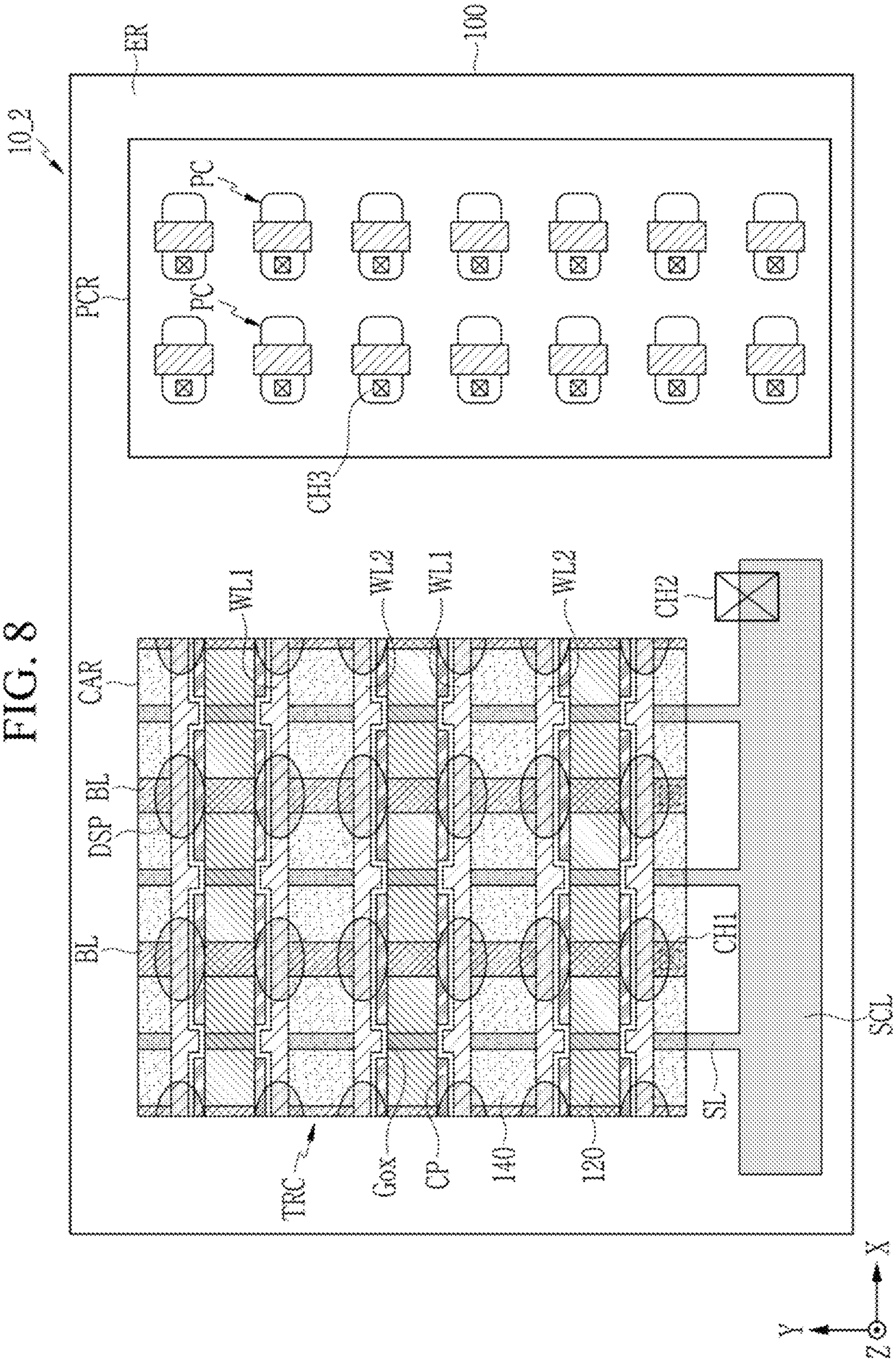
FIG. 8, FIG. 9, FIG. 10A, FIG. 10B, and FIG. 10C are top plan views schematically showing a semiconductor device according to one or more embodiments.

According to an embodiment shown in FIG. 8, the second contact hole CH2 exposing the shielding contact line SCL in the peripheral region ER of the substrate 100 may be positioned to overlap the part of the shielding contact line SCL.

Specifically, the second contact hole CH2 in which the first conductive via (refer to 'UVP1' in FIG. 7) to electrically connect the shielding contact line SCL and the connection line CL may be positioned may be disposed to overlap the part of the shielding contact line SCL. In an embodiment, the first conductive via UVP1 positioned in the second contact hole CH2 may be in contact with the portion of the upper surface of the shielding contact line SCL.

Even in the case of the semiconductor device 10_2, like the semiconductor device 10 according to an embodiment, the shielding contact lines SCL positioned in the peripheral region ER of the substrate 100 and connected to the shielding lines SL may be formed to have a relatively wide width compared to the shielding lines SL formed in the cell array region CAR of the substrate 100.

In an embodiment, the second contact hole CH2 may be formed to expose the part of the shielding contact line SCL, even if the conductive vias positioned in the second contact hole CH2 are in contact with the part of the shielding contact line SCL, and the shielding contact line SCL and the connection line CL may be connected in the peripheral region ER of the substrate 100, which may secure the wide contact area with the conductive via, etc.

In addition, as the second contact hole CH2 is formed to expose the part of the shielding contact line SCL, even when the conductive vias positioned within the second contact hole CH2 are in contact with the part of the shielding contact line SCL, the shielding contact line SCL and the conductive vias may secure the contact area above a certain level. In an embodiment, the spatial relationship between the fine patterns constituting the semiconductor device 10_2 may be diversified.

Figure 9:
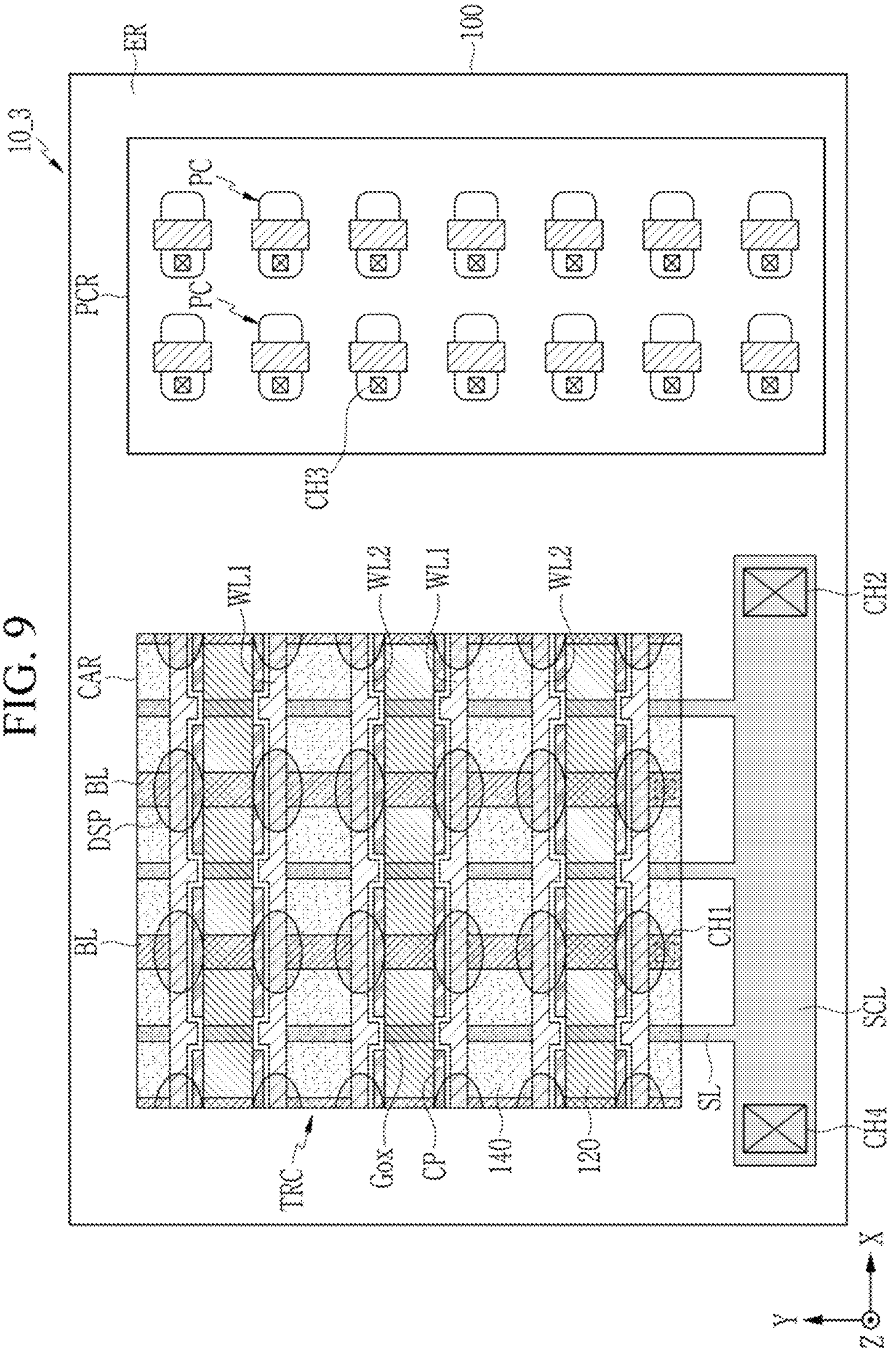

According to the semiconductor device 10_3 shown in FIG. 9, the peripheral region ER of the substrate 100 may include a plurality of contact holes exposing the shielding contact line SCL.

In detail, the semiconductor device 10_3 in FIG. 9, in the peripheral region ER of the substrate 100, may include a second contact hole CH2 positioned at an end portion of the first direction X of the shielding contact line SCL and a fourth contact hole CH4 positioned at another end portion of the first direction X of the shielding contact line SCL.

Although not shown, conductive vias that electrically connect a connection wiring (refer to 'CL' in FIG. 5A) and a shielding contact line SCL may be positioned in the second contact hole CH2 and the fourth contact hole CH4, respectively. For example, the first conductive via UVP1 may be positioned in the second contact hole CH2 and the fourth contact hole CH4, respectively.

That is, as described above, the first conductive via UVP1 positioned in the second contact hole CH2 and the fourth contact hole CH4, respectively, may electrically connect the shielding contact line SCL and the connection line CL.

In an embodiment, the first conductive via UVP1 may be electrically connected to the connection line CL, and the first conductive via UVP1 may be electrically connected to a circuit that applies a voltage to the shielding line SL.

In some embodiments, the connection form of the first conductive via UVP1 positioned within the second contact hole CH2 and the fourth contact hole CH4, respectively, and the connection line CL may vary.

For example, the first conductive via UVP1 positioned within the second contact hole CH2 may have a connection form of the conductive via UVP1 shown in FIG. 5A, and the first conductive via UVP1 positioned within the fourth contact hole CH4 may have a connection form of the first conductive via UVP1 shown in FIG. 5B.

FIG. 9 shows that the second contact hole CH2 and the fourth contact hole CH4 exposing the upper surface of the shielding contact line SCL to connect the connection line CL and the shielding contact line SCL may be respectively positioned at one side of the first direction X of the shielding contact line SCL and the other side of the first direction X, but the position and the number of the second contact hole CH2 are not limited thereto.

For example, each of the second contact hole CH2 and the fourth contact hole CH4 may be positioned only at one end portion or another portion of the first direction X of the shielding contact line SCL, or positioned only at a center portion of the shielding contact line SCL. In addition, at least one of the second contact hole CH2 and the fourth contact hole CH4 may expose at least part of the shielding contact line SCL.

As another example, a plurality of contact holes exposing the shielding contact lines SCL other than the second contact hole CH2 and the fourth contact hole CH4 may be included.

According to the semiconductor device 10_3, as the plurality of contact holes connecting the connection line CL and the shielding contact line SCL are formed, the electrical characteristics of the semiconductor device 10_3 may be improved by reducing the electrical resistance applied to the shielding contact line SCL.

Figure 10A:
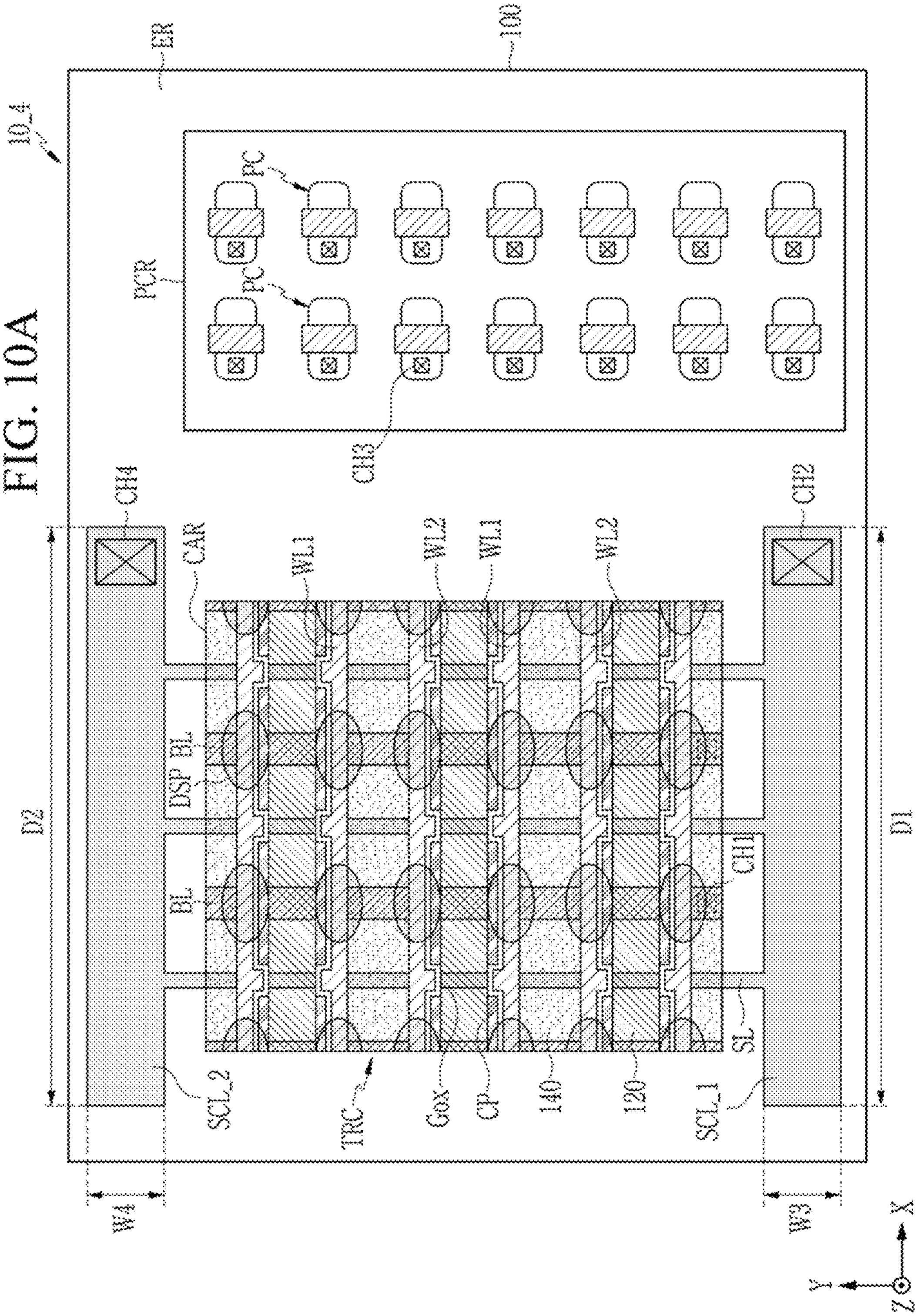
Figure 10B:
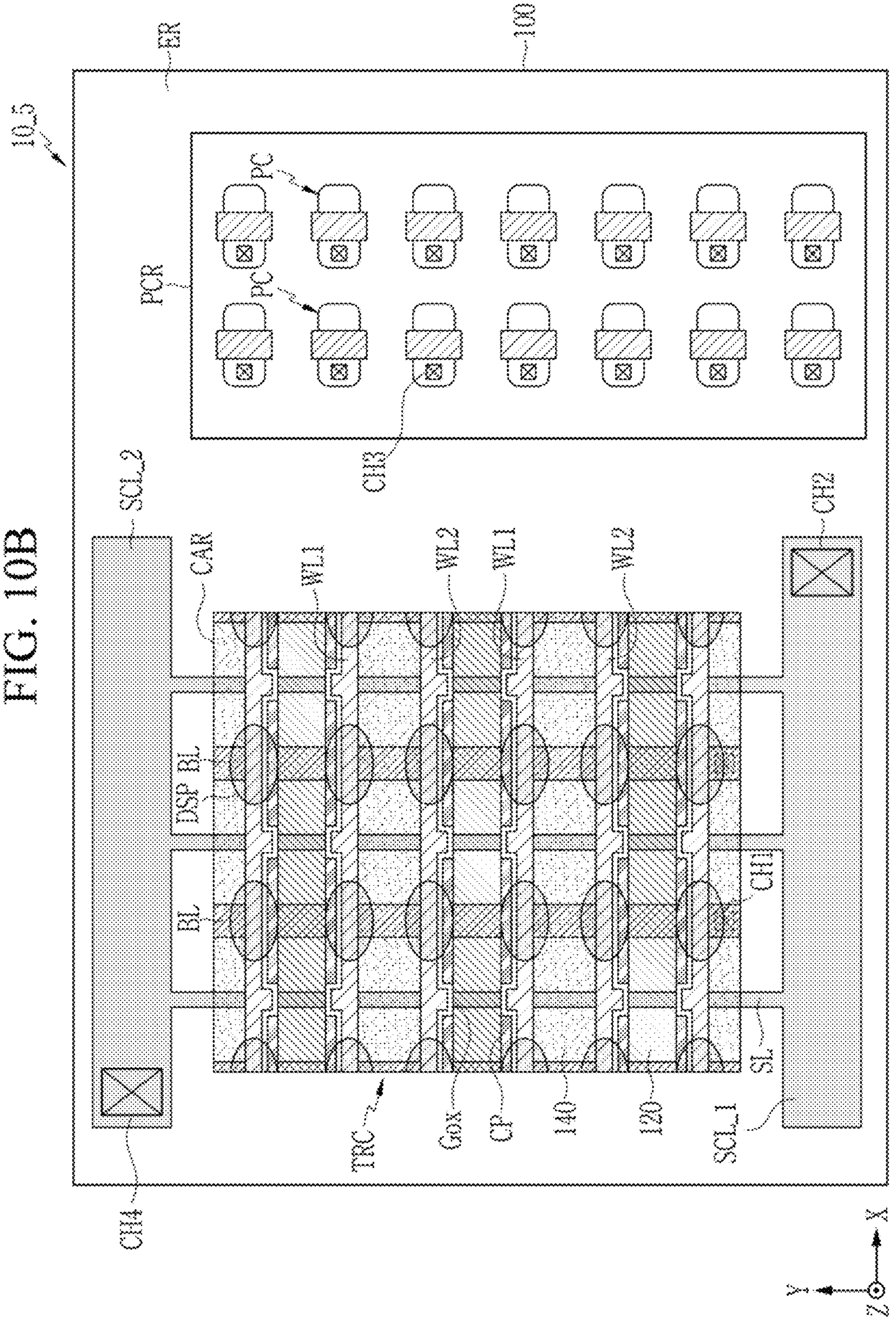
Figure 10C:
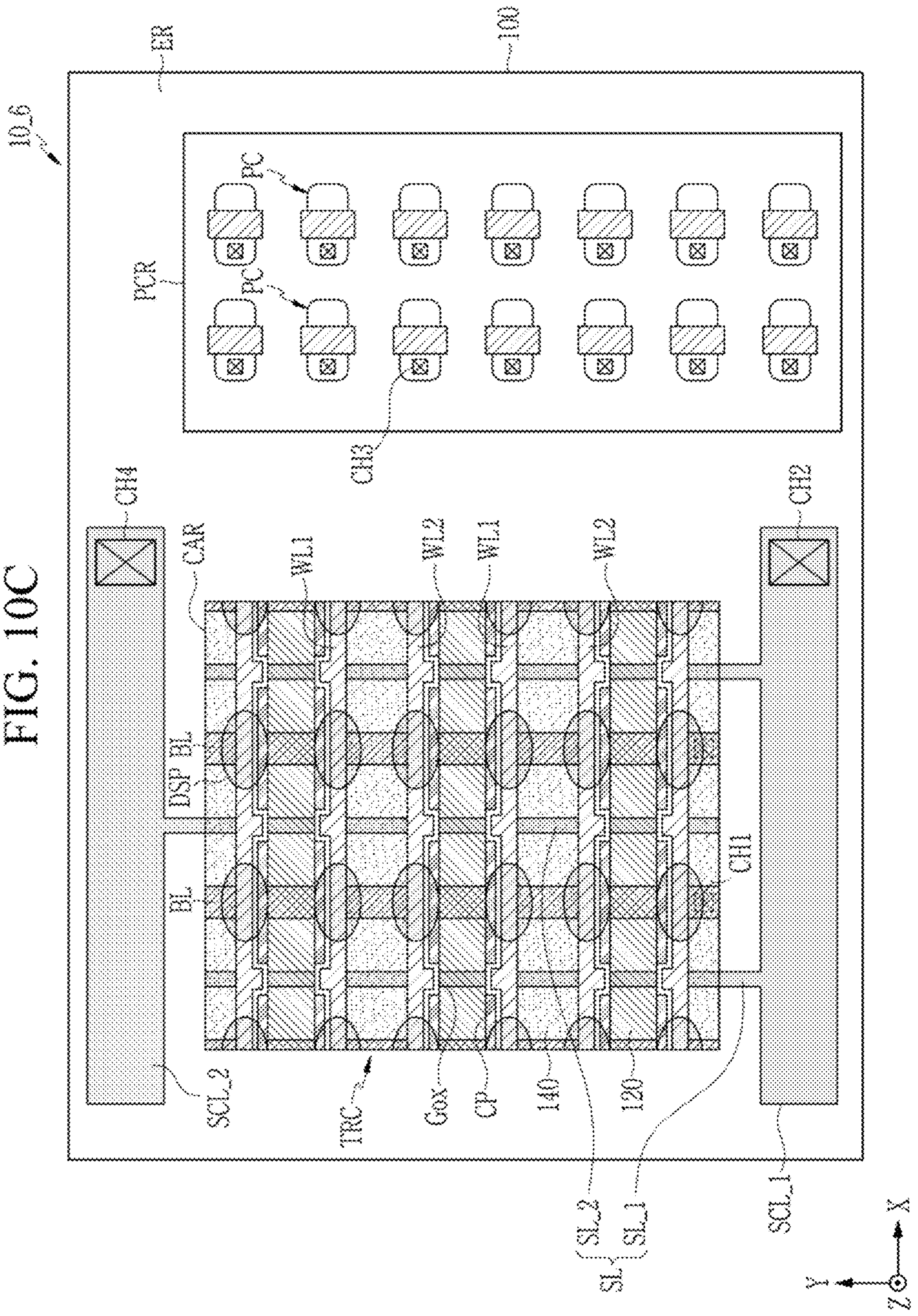

According to the semiconductor devices 10_4, 10_5, and 10_6 shown in FIG. 10A to FIG. 10C, the plurality of shielding contact lines SCL_1 and SCL_2 may be positioned in the peripheral region ER of the substrate 100.

In detail, the semiconductor device 10_4 according to FIG. 10A may include a first shielding contact line SCL_1 extending in the first direction X in the peripheral region ER positioned at one side on the second direction Y of the cell array region CAR of the substrate 100 and a second shielding contact line SCL_2 extending in the first direction X in the peripheral region ER positioned at the other side on the second direction Y of the cell array region CAR. That is, the first shielding contact line SCL_1 and the second shielding contact line SCL_2 may be positioned apart from each other in the second direction Y with the cell array region CAR interposed therebetween.

The plurality of shielding lines SL may extend respectively in one side and the other side of the second direction Y from the cell array region CAR of the substrate 100 toward the peripheral region ER to be connected to the first shielding contact line SCL_1 and the second shielding contact line SCL_2, respectively. That is, the plurality of shielding lines SL may be connected to the first shielding contact line SCL_1 at an end portion of the second direction Y and may be connected to the second shielding contact line SCL_2 at another end portion of the second direction Y.

In an embodiment, the first shielding contact line SCL_1, the second shielding contact line SCL_2, and the plurality of shielding lines SL may be integrally formed. However, the present disclosure is not limited thereto, and the first shielding contact line SCL_1, the second shielding contact line SCL_2, and the plurality of shielding lines SL may be formed as separate configurations by separate processes. When the first shielding contact line SCL_1 and the second shielding contact line SCL_2 are configured in separate configurations, the first shielding contact line SCL_1 and the second shielding contact line SCL_2 may be positioned at different layers and at different levels.

The first shielding contact line SCL_1 may have a first length D1 in the first direction X, and the second shielding contact line SCL_2 may have a second length D2 in the first direction X. In FIG. 10A, the first length D1 and the second length D2 were shown to be substantially the same, but the present disclosure is not limited thereto.

For example, the first length D1 and the second length D2 may be different. That is, the first length D1 and the second length D2 may be different according to the area of the peripheral region ER of the substrate 100 where the first shielding contact line SCL_1 and the second shielding contact line SCL_2 are positioned.

The first shielding contact line SCL_1 may have a third width W3 in the second direction Y, and the second shielding contact line SCL_2 may have a fourth width W4 in the second direction Y. Here, the width may mean a width along the second direction Y. In FIG. 10A, the third width W3 and the fourth width W4 were shown to be substantially the same, but the present disclosure is not limited thereto.

For example, the third width W3 and the fourth width W4 may be different. That is, the third width W3 and the fourth width W4 may be different according to the area of the peripheral region ER of the substrate 100 where the first shielding contact line SCL_1 and the second shielding contact line SCL_2 are positioned.

In some embodiments, the areas on a plane of the first shielding contact line SCL_1 and the second shielding contact line SCL_2 may be different. For example, the first length D1 and the second length D2 may be substantially the same, and the third width W3 and the fourth width W4 may be different.

As another example, the first length D1 and the second length D2 may be different, and the third width W3 and the fourth width W4 may be substantially the same.

As another example, the first length D1 and the second length D2 may be different, and the third width W3 and the fourth width W4 may be different.

The semiconductor device 10_4 according to an embodiment may include a second contact hole CH2 exposing the first shielding contact line SCL_1 to electrically connect the first shielding contact line SCL_1 and the connection wiring (referring to 'CL' of FIG. 5A) in the one side peripheral region ER of the substrate 100 and a fourth contact hole CH4 exposing the second shielding contact line SCL_2 to electrically connect the second shielding contact line SCL_2 and the connection line CL in the other side peripheral region ER of the substrate 100.

FIG. 10A shows that each of the second contact hole CH2 and the fourth contact hole CH4 may be respectively positioned on an end portion of the first direction X of the first shielding contact line SCL_1 and the second shielding contact line SCL_2, but each position of the second contact hole CH2 and the fourth contact hole CH4 is not limited thereto. For example, as shown in FIG. 10B, the second contact hole CH2 may be positioned at an end portion of the first direction X of the first shielding contact line SCL_1, and the fourth contact hole CH4 may be positioned at another end portion of the first direction X of the second shielding contact line SCL_2.

Also, FIG. 10A shows that on contact hole may be positioned in each of the first shielding contact line SCL_1 and the second shielding contact line SCL_2, but the present disclosure is not limited, and a plurality of contact holes may be positioned in each of the first shielding contact line SCL_1 and the second shielding contact line SCL_2.

As another example, at least one of the second contact hole CH2 and the fourth contact hole CH4 may expose at least part of the shielding contact line SCL.

Although not shown, a conductive via electrically connecting the connection line CL and the shielding contact line SCL may be positioned in the second contact hole CH2 and the fourth contact hole CH4, respectively. For example, the first conductive via UVP1 may be positioned in the second contact hole CH2 and the fourth contact hole CH4, respectively.

As described above, the first conductive via UVP1 positioned in the second contact hole CH2 and the fourth contact hole CH4, respectively, may electrically connect the shielding contact line SCL and the connection line CL.

In an embodiment, the first conductive via UVP1 may be electrically connected to the connection line CL, and the connection line CL may be electrically connected to a circuit for applying a voltage to the shielding line SL.

For example, the first conductive via UVP1 positioned in the second contact hole CH2 and the first conductive via UVP1 positioned in the fourth contact hole CH4 are connected to the same connection line CL, and the same voltage may be applied to the shielding line SL.

As another example, the first conductive via UVP1 positioned in the second contact hole CH2 and the first conductive via UVP1 positioned in the fourth contact hole CH4 may be connected to different connection lines CL and apply the same voltage to the shielding line SL.

Even in the case of the semiconductor device 10_4, the substantially same effect as an embodiment shown in FIG. 9 may be obtained.

According to the semiconductor device 10_5 shown in FIG. 10B, the plurality of shielding lines SL may be connected between the first shielding contact line SCL_1 and the second shielding contact line SCL_2. For example, each of the plurality of shielding lines SL may be connected to the first shielding contact line SCL_1 and the second shielding contact line SCL_2.

According to the semiconductor device 10_6 shown in FIG. 10C, first shielding lines of the plurality of shielding lines SL may be connected to the first shielding contact line SCL_1, and second shielding lines of the plurality of shielding lines SL may be connected to the second shielding contact line SCL_2. The first shielding lines and the second shielding lines may be connected to the first shielding contact line SCL_1 or the second shielding contact line SCL_2. The first shielding lines and the second shielding lines may be alternately disposed in the first direction X.

That is, the plurality of shielding lines SL may include a first shielding line SL_1 extending in the second direction Y from the cell array region CAR of the substrate 100 toward the peripheral region ER and connected to the first shielding contact line SCL_1 and a second shielding line SL_2, adjacent to the first shielding line SL_1 in the first direction X, extending in opposite the second direction Y from the cell array region CAR toward the peripheral region ER and connected to the second shielding contact line SCL_2.

In an embodiment, the first shielding contact line SCL_1 and the first shielding line SL_1 may be integrally formed. The second shielding contact line SCL_2 and the second shielding line SL_2 may be formed as separate configurations by a separate process from the first shielding contact line SCL_1 and the first shielding line SL_1. However, the present disclosure is not limited thereto, and the first shielding contact line SCL_1, the first shielding line SL_1, the second shielding contact line SCL_2, and the second shielding line SL_2 may be formed by the same process and may be configured separately.

As described above, the first conductive via (referring to 'UVP1' in FIG. 5A) positioned within the second contact hole CH2 and the fourth contact hole CH4 respectively may electrically connect the shielding contact lines SCL_1 and SCL_2 and the connection line (referring to 'CL' in FIG. 5A).

In an embodiment, the first conductive via UVP1 may be electrically connected to the connection line CL, and the connection line CL may be electrically connected to a circuit for applying a voltage to the shielding line SL.

For example, the first conductive via UVP1 positioned in the second contact hole CH2 and the first conductive via UVP1 positioned in the fourth contact hole CH4 may be connected to the same connection line CL, and may apply the same voltage to the first shielding line SL_1 and the second shielding line SL_2, respectively.

As another example, the first conductive via UVP1 positioned within the second contact hole CH2 may be connected to the connection line CL, and the first conductive via UVP1 positioned within the fourth contact hole CH4 may be connected to conductive patterns positioned at a higher level or a lower level than the connection line CL and may apply the same voltage to each of the first shielding line SL_1 and the second shielding line SL_2.

As another example, the first conductive via UVP1 positioned in the second contact hole CH2 may be connected to the connection line CL connected to the peripheral circuit PC positioned in the peripheral circuit region PCR, the first conductive via UVP1 positioned in the fourth contact hole CH4 may be connected to the connection line CL connected to the core circuit SA positioned in the cell array region CAR, and different voltages may be applied to each of the first shielding line SL_1 and the second shielding line SL_2.

Even in the case of the semiconductor device 10_6 according to an embodiment, the semiconductor device 10_6 may have substantially the same effect as an embodiment shown in FIG. 9, and the electric characteristic of the semiconductor device 10_6 may be improved by differentiating the voltage applied to each of the first shielding line SL_1 and the second shielding line SL_2 according to a coupling capacitance between the bit lines BL, which may be due to a mutual interference.

Hereinafter, a manufacturing method of the semiconductor device is described with reference to FIG. 11 to FIG. 25. Hereinafter, the same configurations described previously are referred to by the same reference numerals, and the duplicate descriptions may be omitted or simplified, and the differences will be mainly described. The description herein relates to a method for manufacturing the semiconductor device according to an embodiment of FIG. 1 to FIG. 5B and is further described with reference to FIG. 1 to FIG. 5B.

FIG. 11 to FIG. 25 are top plan views and cross-sectional views for explaining a manufacturing method of a semiconductor device according to an embodiment.

Specifically, FIG. 11, FIG. 14, FIG. 17, FIG. 20, and FIG. 23 are the plan views for explaining the manufacturing method of the semiconductor device according to an embodiment. FIG. 12, FIG. 13, FIG. 15, FIG. 16, FIG. 18, FIG. 19, FIG. 21, FIG. 22, FIG. 24, and FIG. 25 are the cross-sectional views each cut along the cutting line of the corresponding plan views.

Figure 11:
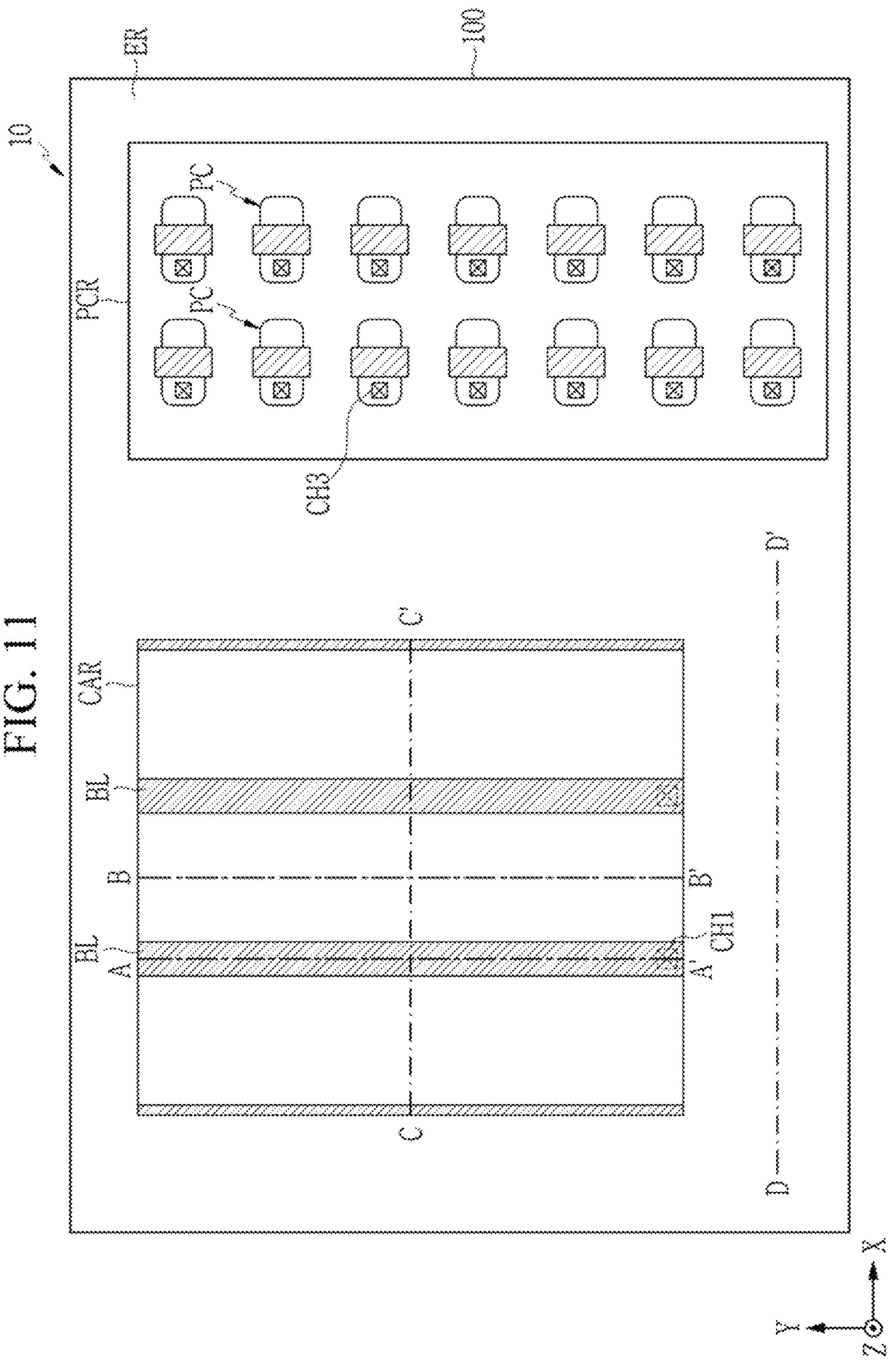
FIG. 11, FIG. 12, FIG. 13, FIG. 14, FIG. 15, FIG. 16, FIG. 17, FIG. 18, FIG. 19, FIG. 20, FIG. 21, FIG. 22, FIG. 23, FIG. 24, and FIG. 25 are top plan views and cross-sectional views for explaining a manufacturing method of a semiconductor device according to an embodiment.
Figure 12:
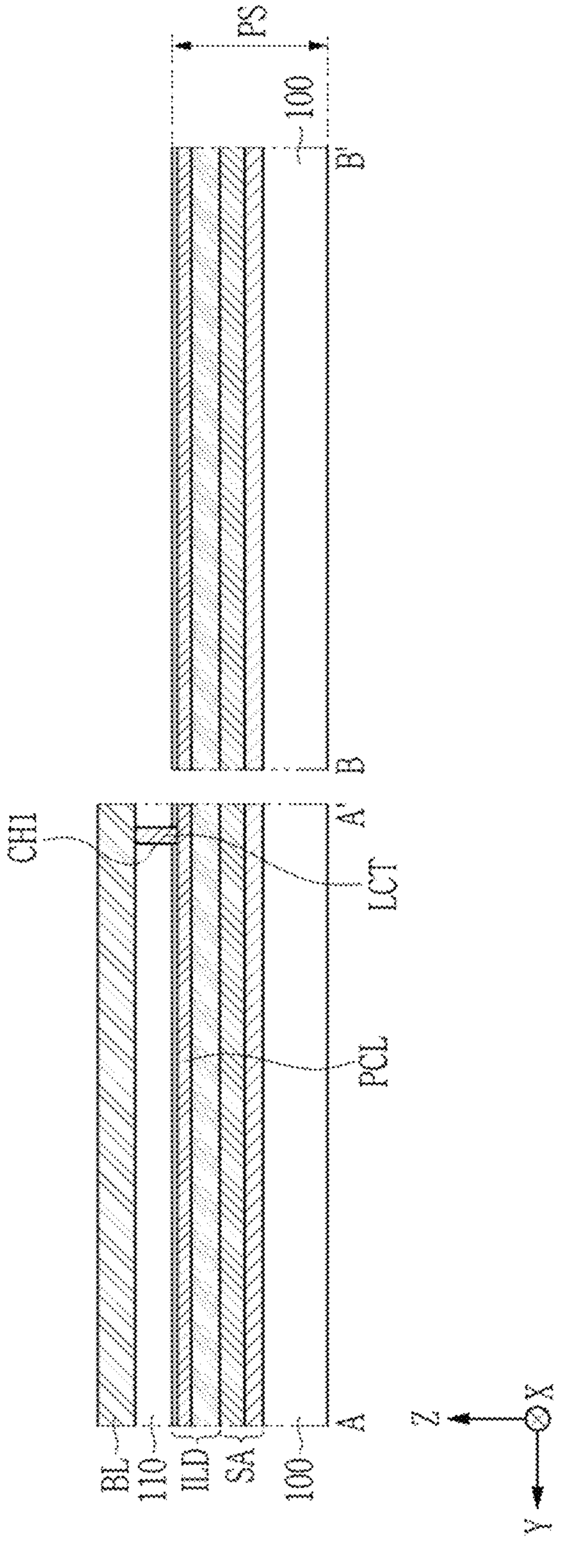
Figure 13:
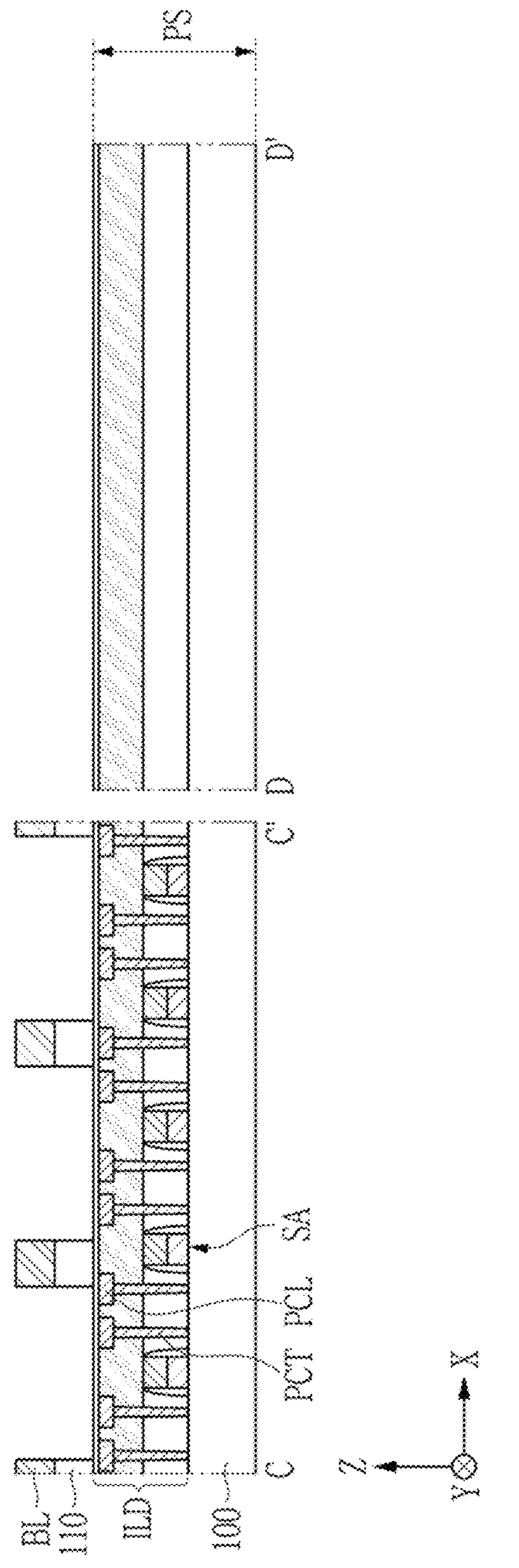

Referring to FIG. 11 to FIG. 13, a peripheral circuit structure PS including a core circuits SA and a peripheral circuits PC may be formed on a substrate 100.

The substrate 100 may include a cell array region CAR and a peripheral region ER surrounding the cell array region CAR on a plane extending in a first direction X and a second direction Y. The peripheral region ER may include a peripheral circuit region PCR positioned apart from the cell array region CAR in the first direction X on a plane. However, the present disclosure is not limited thereto, and in some embodiments, the substrate 100 may further include other regions, and some regions may be omitted. For example, the peripheral circuit region PCR positioned in the peripheral region ER may be omitted.

Core circuits SA may be formed on the cell array region CAR of the substrate 100, and peripheral circuits PC may be formed in the peripheral circuit region PCR. The core circuits SA and peripheral circuits PC may include NMOS and PMOS transistors integrated on the substrate 100.

A peripheral circuit insulation layer ILD covering the core circuits SA and peripheral circuits PC may be formed on the substrate 100.

The peripheral circuit insulation layer ILD may include multi-layered insulation layers. For example, the peripheral circuit insulation layer ILD may include a silicon oxide layer, a silicon nitride layer, a silicon oxynitride layer, and/or a low dielectric layer. However, the present disclosure is not limited thereto, and the composition and material of the peripheral circuit insulation layer ILD may be variously changed.

A peripheral circuit contact plugs PCT and a peripheral circuit wirings PCL may be formed in the peripheral circuit insulation layer ILD. The peripheral circuit contact plugs PCT and the peripheral circuit wirings PCL may be electrically connected to the core circuits SA and peripheral circuits PC.

A first insulation layer 110 covering the entire surface of the substrate 100 may be formed on the peripheral circuit insulation layer ILD. The first insulation layer 110 may include the same material as the peripheral circuit insulation layer ILD. However, the material included in the first insulation layer 110 is not limited thereto and may be variously changed.

A first contact hole CH1 penetrating the first insulation layer 110 may be formed, and a peripheral circuit structure PS or lower contact plugs LCT connected to the peripheral circuit wirings PCL may be formed in the first contact hole CH1.

In the cell array region CAR of the substrate 100, bit lines BL extending in the second direction Y and spaced apart from each other in the first direction X may be formed on the first insulation layer 110.

The process of forming the bit lines BL may include forming the bit lines BL by depositing a conductive material layer on the first insulation layer 110 and patterning the conductive material layer and the first insulation layer 110 in the cell array region CAR.

In the process of forming the bit lines BL, the cell array region CAR and the first insulation layer 110 positioned in the peripheral region ER positioned on one side of the second direction Y of the cell array region CAR may be together patterned.

In an embodiment, in the cell array region CAR, the bit line BL and the first insulation layer 110 overlapping in the third direction Z vertical to the substrate 100 may be formed, and the upper surface of the peripheral circuit insulation layer ILD positioned between the bit lines BL in the cell array region CAR and the upper surface of the peripheral circuit insulation layer ILD in the peripheral region ER positioned at one side of the second direction Y of the cell array region CAR may be exposed.

The conductive material layer for forming the bit line BL may include, for example, a doped polysilicon, a metal, a conductive metal nitride, a conductive metal silicide, a conductive metal oxide, or a combination thereof.

Alternatively, the conductive material layer may be a doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx, or a combination thereof, but is not limited thereto, and the material included in the conductive material layer for forming the bit line BL may be variously changed.

Figure 14:
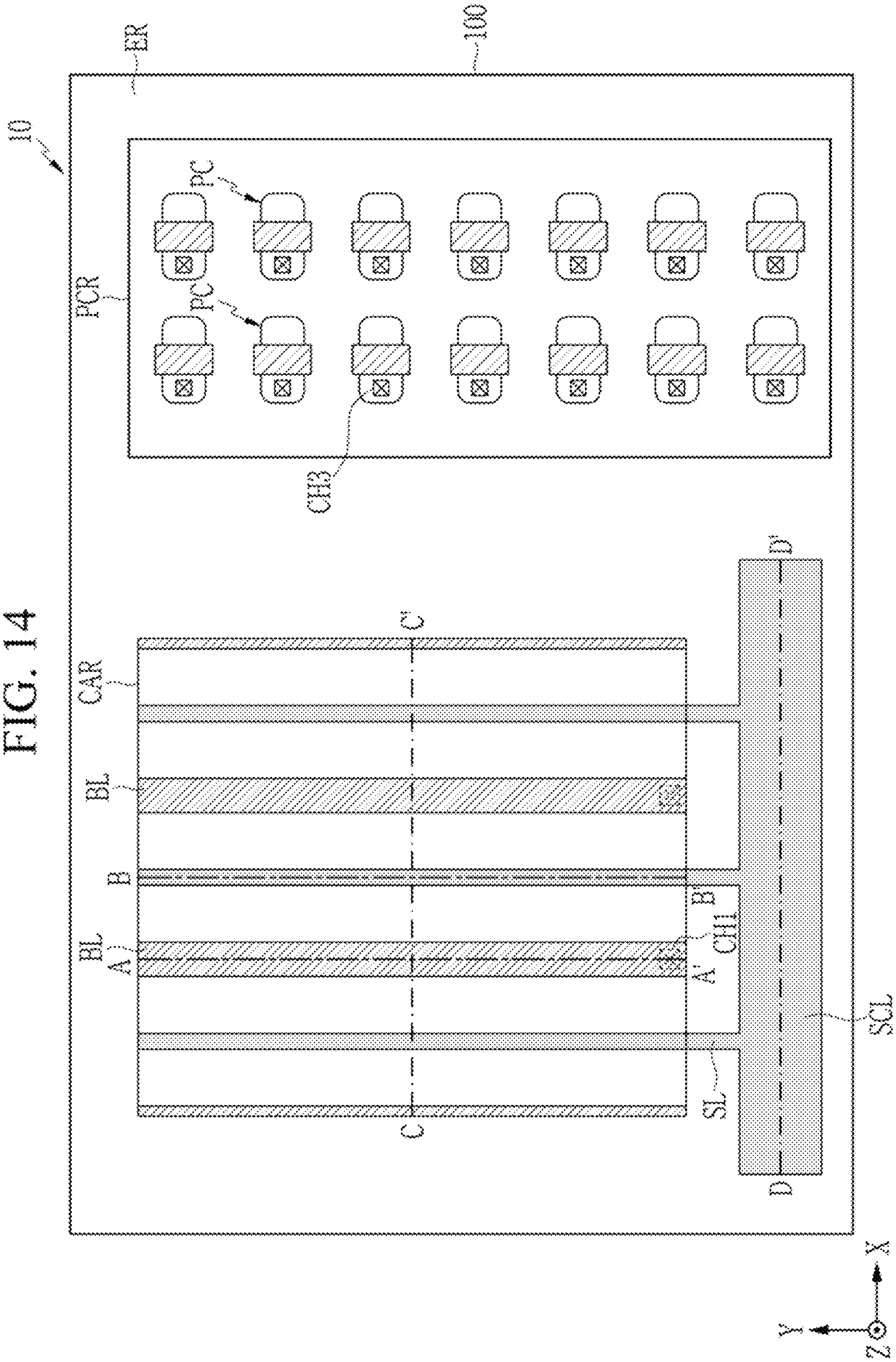
Figure 15:
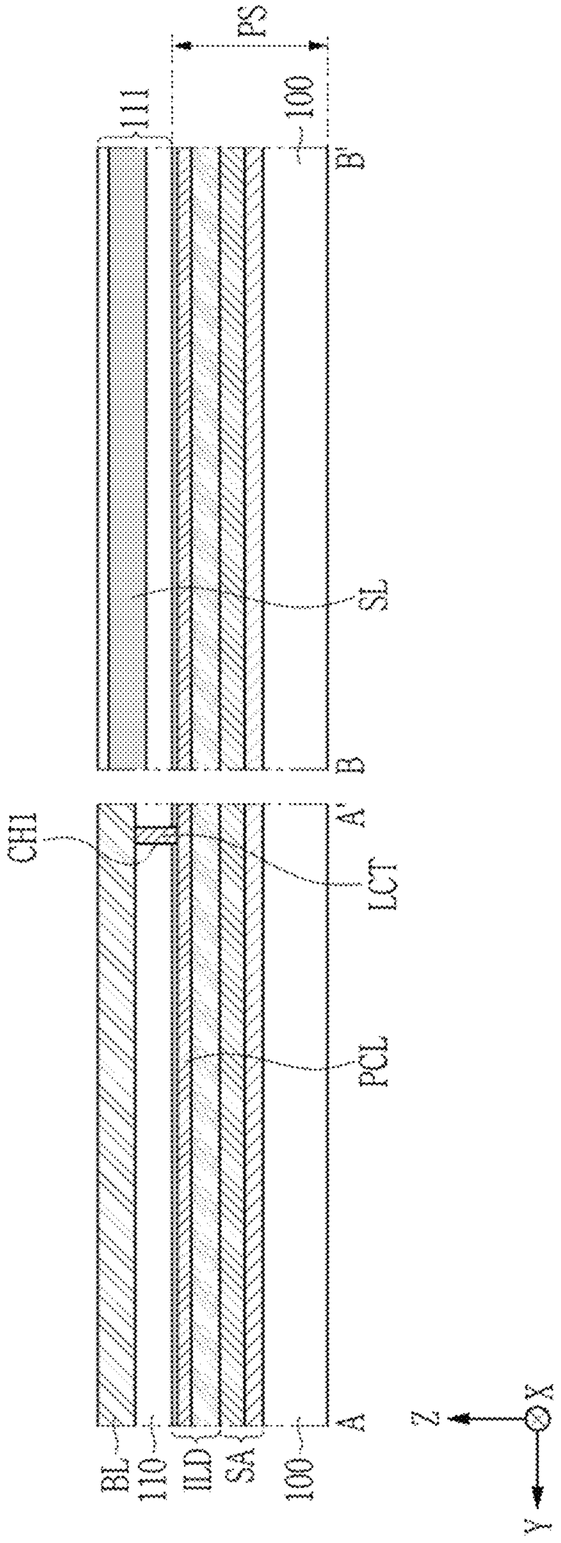
Figure 16:
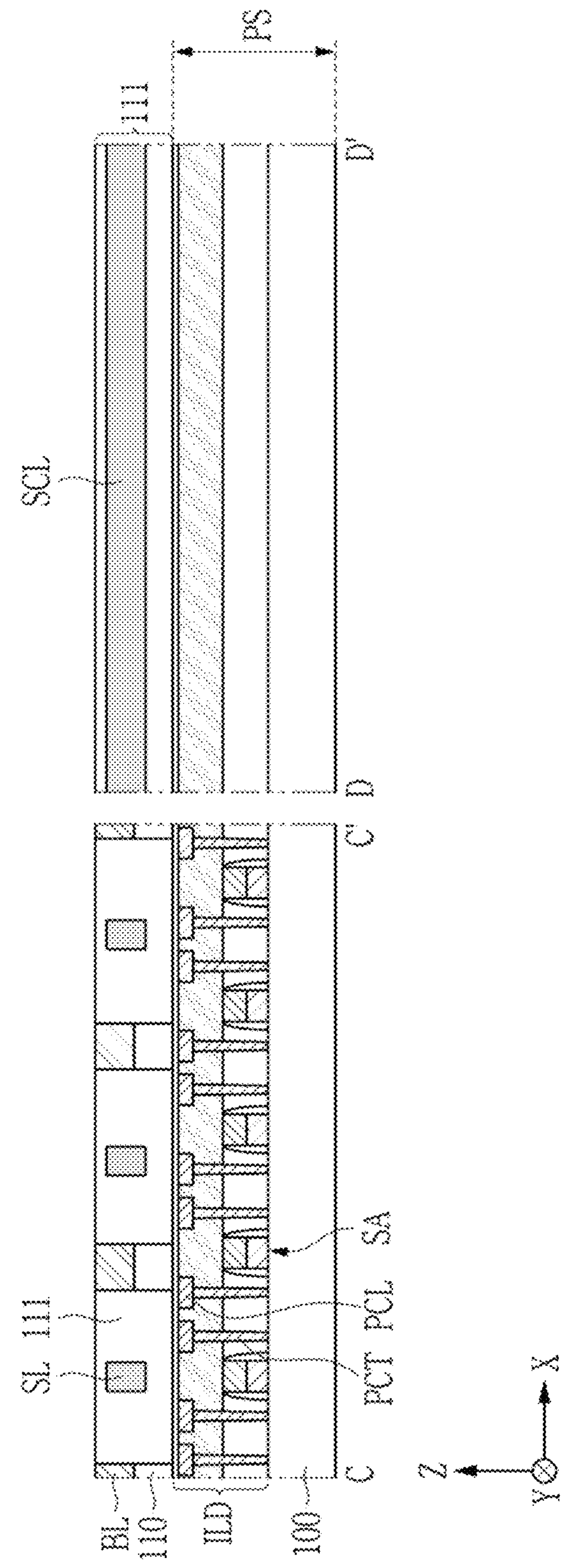

Referring to FIG. 14, FIG. 15, and FIG. 16, shielding lines SL positioned between the bit lines BL and extending in the second direction Y to reach the peripheral region ER from the cell array region CAR and a shielding contact line SCL positioned in the peripheral region ER, connected to an end portion of the shielding lines SL, and extending in the first direction X.

In an embodiment, a second insulation layer 111 may be formed on the peripheral circuit insulation layer ILD. The second insulation layer 111 may be formed on the entire surface of the substrate 100. In the cell array region CAR of the substrate 100, the second insulation layer 111 may fill the space between the bit lines BL. In addition, the second insulation layer 111 may also be formed on the upper surface of the bit line BL.

The second insulation layer 111 may include, for example, a silicon oxide layer, a silicon nitride layer, a silicon oxynitride layer, and/or a low dielectric layer. However, the material included in the second insulation layer 111 is not limited thereto and may be variously changed.

A trench may be formed in the second insulation layer 111 by recessing the second insulation layer 111. The trench may be positioned between the bit lines BL in the cell array region CAR and positioned in the peripheral region ER adjacent to one side of the second direction Y of the cell array region CAR from the upper surface toward the bottom surface.

The trench formed in the second insulation layer 111 positioned between the bit lines BL in the cell array region CAR may extend in the second direction Y. The trench may be spaced apart from an adjacent trench in the first direction X with the bit line BL interposed therebetween.

The trench formed in the second insulation layer 111 positioned in the peripheral region ER adjacent to one side of the second direction Y of the cell array region CAR may extend in the first direction X.

The width of the trench formed in the second insulation layer 111 positioned in the peripheral region ER adjacent to one side of the second direction Y of the cell array region CAR may be greater than the width of the trench formed in the second insulation layer 111 positioned between the bit lines BL in the cell array region CAR.

The bottom surface of the trench formed on the second insulation layer 111 may be positioned at a level between the upper surface and the bottom surface of the first insulation layer 110. However, the level of the bottom surface of the train device formed on the second insulation layer 111 is not limited thereto and may be variously changed.

A conductive material layer for forming a shielding line SL and a shielding contact line SCL may be formed on the second insulation layer 111. The conductive material layer for forming the shielding line SL and the shielding contact line SCL may fill the trench formed in the second insulation layer 111. In addition, the conductive material layer for forming the shielding line SL and the shielding contact line SCL may also be formed on the upper surface of the second insulation layer 111.

The conductive material layer may be layered using at least one among physical vapor deposition (PVD), thermal chemical vapor deposition (thermal CVD), low pressure chemical vapor deposition (LP-CVD), plasma enhanced chemical vapor deposition (PE-CVD) or atomic layer deposition (ALD) techniques. However, a method of depositing the conductive material layer is not limited thereto and may be variously changed.

The conductive material layer for forming the shielding line SL and the shielding contact line SCL is, for example, the shielding line SL may include a metal material such as tungsten (W), titanium (Ti), nickel (Ni), cobalt (Co), or a combination thereof.

In some embodiments, the conductive material layer for forming the shielding line SL and the shielding contact line SCL may include two-dimensional and three-dimensional materials. For example, it may include graphene, which is a carbon-based two-dimensional material, carbon nanotube, which is a three-dimensional material, or a combination thereof. However, the conductive material layer for forming the shielding line SL and the shielding contact line SCL is not limited thereto and may be variously changed.

A portion of the conductive material layer for forming the shielding line SL and the shielding contact line SCL filled in the trench formed in the second insulation layer 111 may be recessed from the upper surface toward the bottom surface.

In an embodiment, the upper surface of the conductive material layer for forming the shielding line SL and the shielding contact line SCL filled in the trench formed in the second insulation layer 111 may be positioned at a lower level than the upper surface of the bit line BL.

In addition, the bottom surface of the conductive material layer for forming the shielding line SL and the shielding contact line SCL in the trench formed on the second insulation layer 111 may be positioned at a level between the upper surface and the bottom surface of the first insulation layer 110.

The second insulation layer 111 may be formed on the shielding line SL and the shielding contact line SCL to cover the upper surface of the shielding line SL and the upper surface of the shielding contact line SCL.

In an embodiment, the shielding line SL and the shielding contact line SCL may be buried in the second insulation layer 111. That is, the upper surface, the bottom surface, and the side surfaces of the shielding line SL and the shielding contact line SCL may be surrounded by the second insulation layer 111.

A process of planarizing the second insulation layer 111 may be performed and the upper surface of the bit lines BL may be exposed. The planarization process may include, for example, a chemical mechanical polishing (CMP) process, but is not limited thereto and may be variously changed.

The second insulation layer 111 positioned on the upper surface of the bit lines BL may be removed by the planarization process, and the upper surface of bit lines BL may be exposed. In addition, the upper surface of the second insulation layer 111 may be positioned at the substantially same level as the upper surface of the bit lines BL.

In an embodiment, the shielding line SL and the shielding contact line SCL may be simultaneously formed in the same process step and be integrally formed. However, the present disclosure is not limited thereto, and the shielding line SL and the shielding contact line SCL may be formed by separate processes and may be made of separate configurations. In addition, a method of forming the shielding line SL and the shielding contact line SCL in the second insulation layer 111 and the second insulation layer 111 is not limited thereto, and may be formed by various methods.

Figure 17:
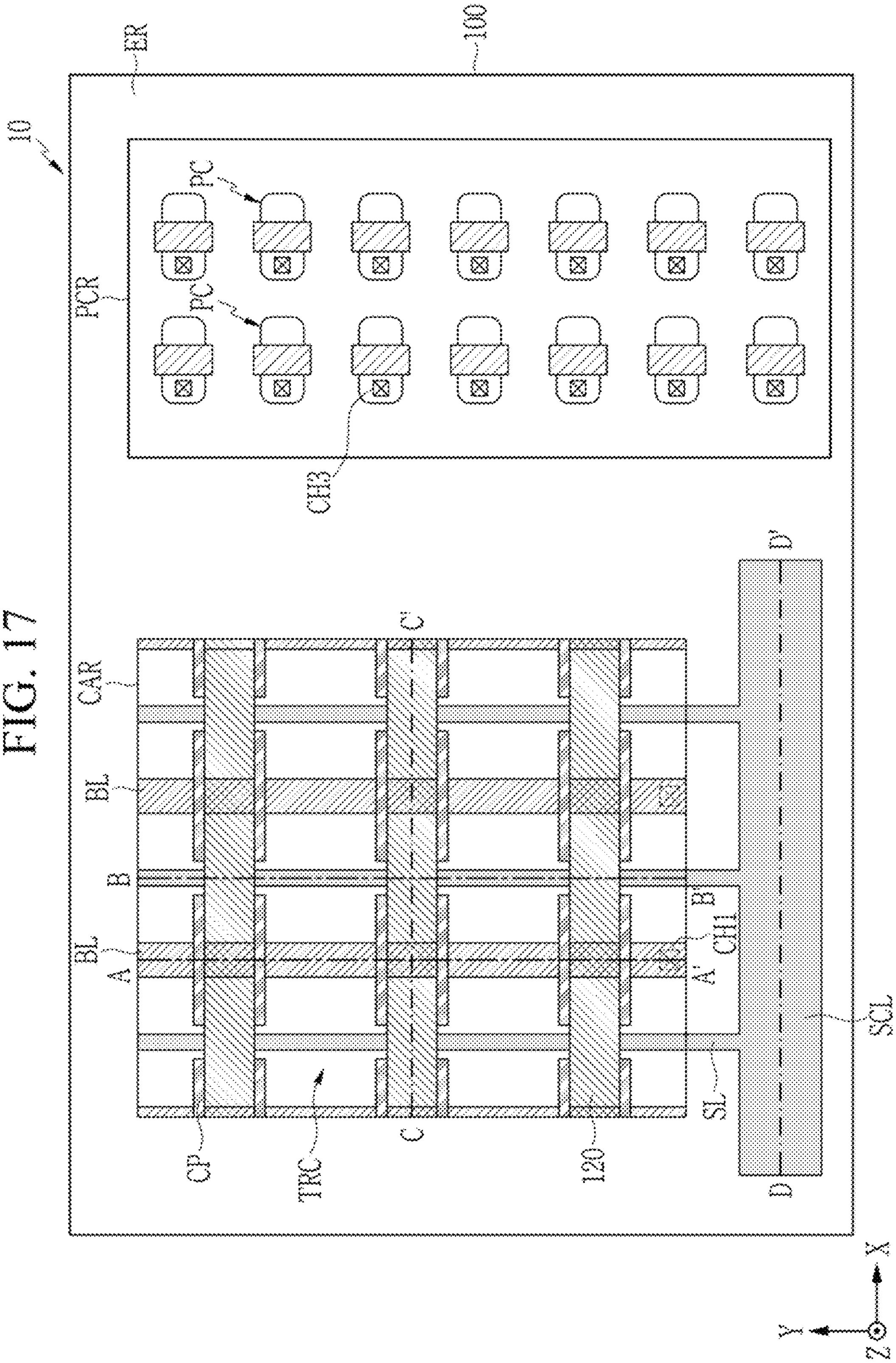
Figure 18:
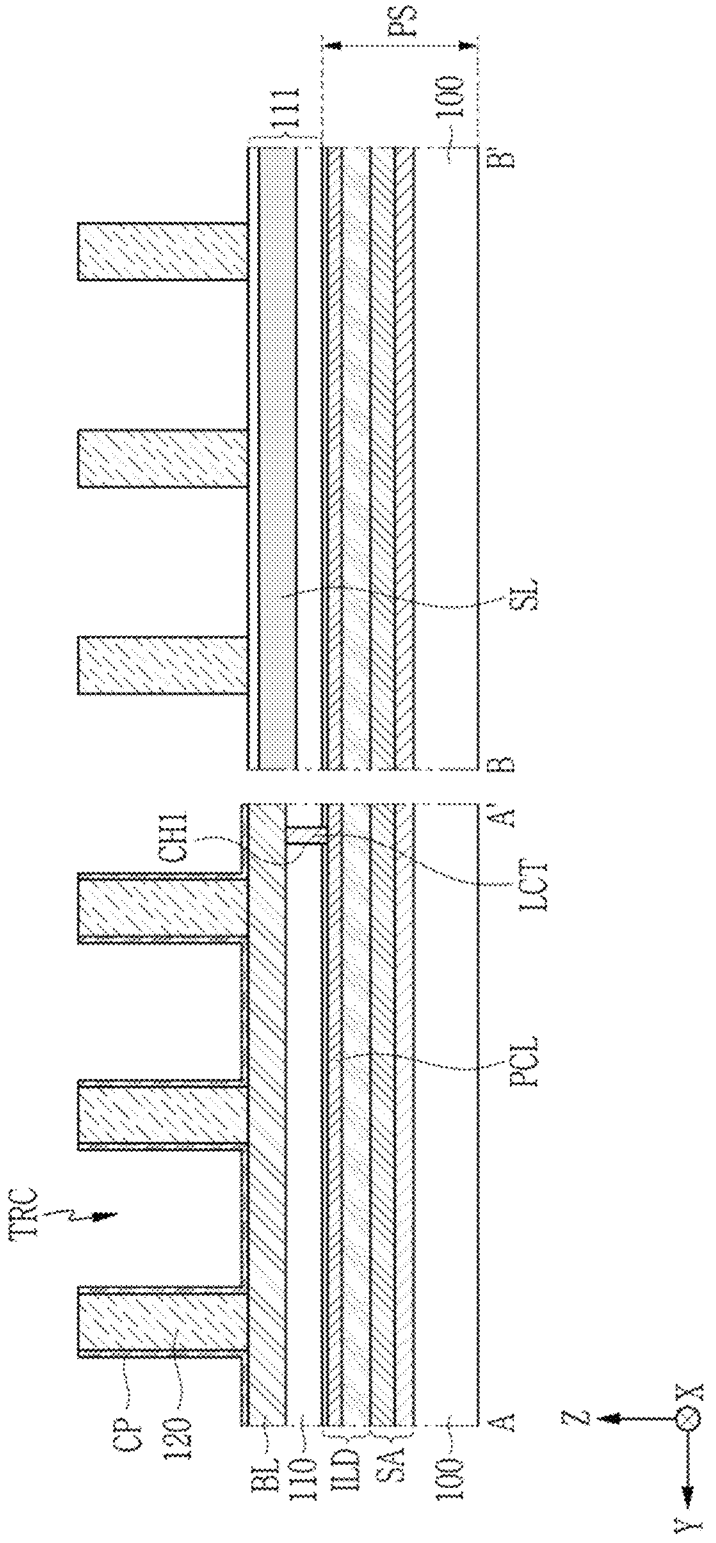
Figure 19:
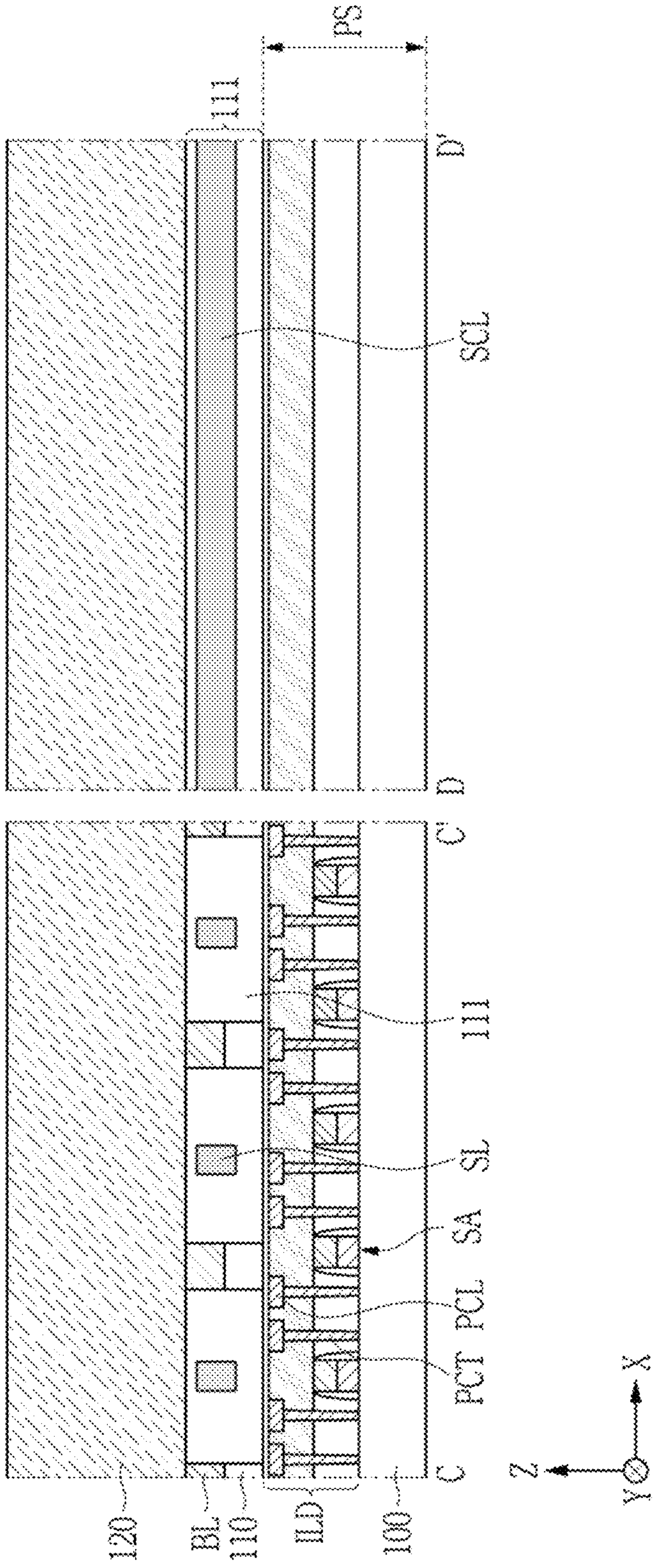

Referring to FIG. 17, FIG. 18, and FIG. 19, a first insulation pattern 120 defining trenches TRC extending in a first direction X on the bit lines BL and spaced apart from each other in a second direction Y may be formed.

The first insulation pattern 120 may be formed on the bit line BL and the second insulation layer 111 in the cell array region CAR of the substrate 100. In addition, the first insulation pattern 120 may be formed on the second insulation layer 111 in the peripheral region ER of the substrate 100.

The trenches TRC defined by the first insulation pattern 120 may be formed across the bit lines BL. The trenches TRC defined by the first insulation pattern 120 may expose the bit lines BL and the shielding lines SL.

The first insulation pattern 120 may be formed of, for example, a silicon oxide layer, a silicon nitride layer, a silicon oxynitride layer, and/or a low dielectric layer. However, the material included in the first insulation pattern 120 is not limited thereto and may be variously changed.

A channel pattern material layer may be conformally deposited on the upper surface and the side surface of the first insulation patterns 120, the upper surface of the bit line BL, and the second insulation layer 111.

The channel pattern material layer may be deposited using at least one of techniques of a physical vapor deposition (PVD), a thermal chemical vapor deposition (thermal CVD), a low pressure chemical vapor deposition (LP-CVD), a plasma enhanced chemical vapor deposition (PE-CVD) or an atomic layer deposition (ALD). However, a method of depositing the channel pattern material layer is not limited thereto and may be variously changed.

The channel pattern material layer may include a semiconductor material, an oxide semiconductor material, or a two-dimensional semiconductor material. The channel pattern material layer may include, for example, silicon, germanium, silicon-germanium or indium gallium zinc oxide (IGZO).

A channel pattern CP may be formed in the cell array region CAR of the substrate 100 by patterning the channel pattern material layer. The channel pattern CP may be spaced apart from an adjacent channel pattern disposed in the second direction Y. The channel pattern CP may be formed by patterning the channel pattern material layer.

In addition, the channel pattern CP in the trench TRC may do not overlap the shielding lines SL in the third direction Z vertical to the substrate 100. For example, the sections of the channel pattern CP in the trench TRC may be spaced apart from the shielding lines SL in a plan view. The sections of channel pattern CP and the shielding lines SL may be positioned spaced apart in the first direction X, with the shielding line SL interposed between adjacent sections of the channel pattern CP in a plan view. For example, the shielding lines SL may overlap a gap in the channel pattern CP, where the gap is defined by a space between adjacent sections of the channel pattern CP.

The channel pattern CP may be formed along the profile of the trench TRC, and the upper surface of the channel pattern CP may be positioned on the substantially same level as the upper surface of the first insulation pattern 120. The channel pattern CP may be a part of the channel pattern material layer remaining in the trench TRC during the patterning of the channel pattern material layer. However, a method for forming the channel pattern CP and the arrangement of the channel pattern CP are not limited thereto and may be variously changed.

The process of forming the channel pattern CP may include a process of forming a sacrificial layer in the trench TRC, forming a mask pattern on the sacrificial layer to pattern the channel pattern material layer, and removing the sacrificial layer and the mask pattern.

Figure 20:
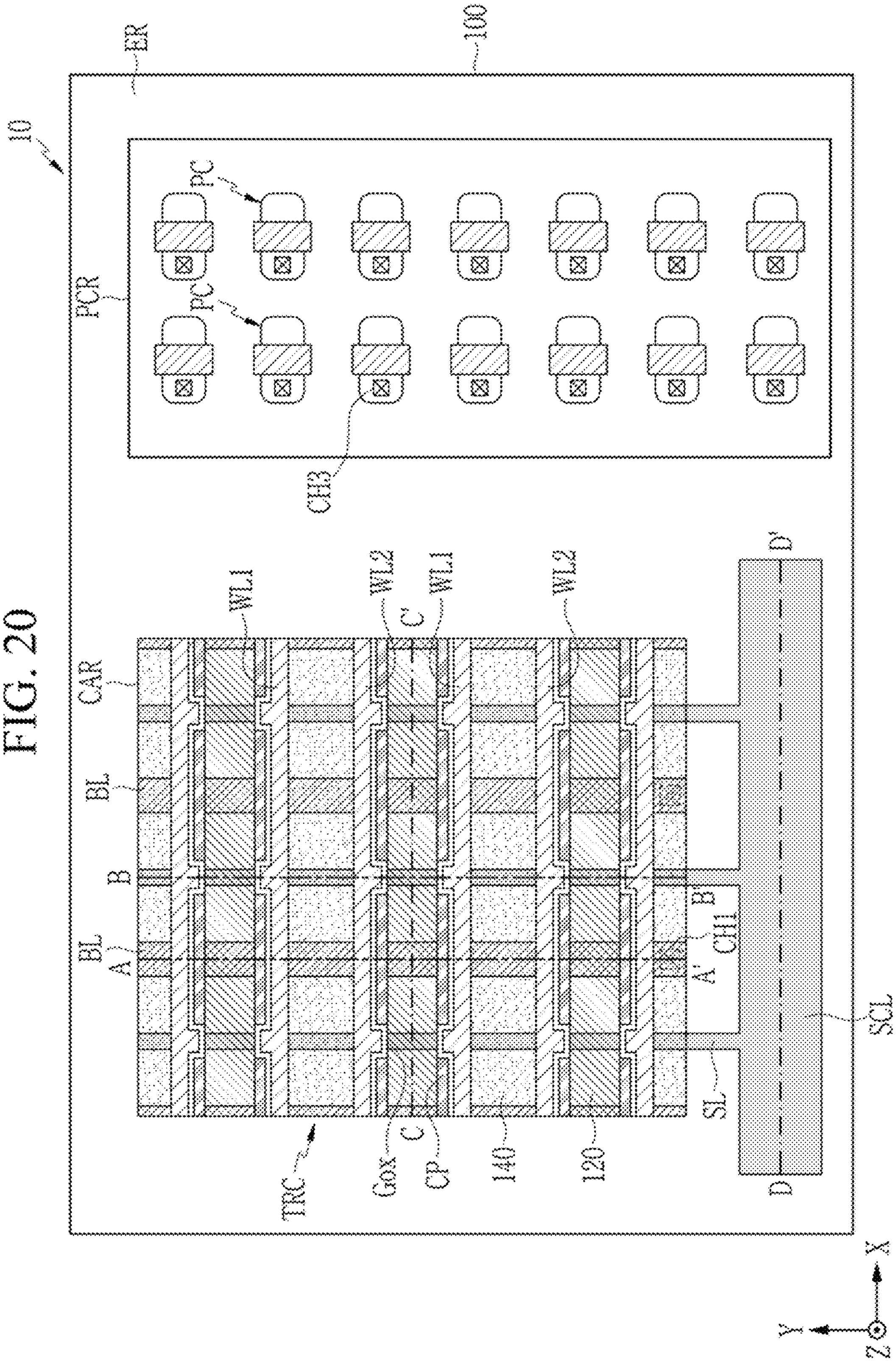
Figure 21:
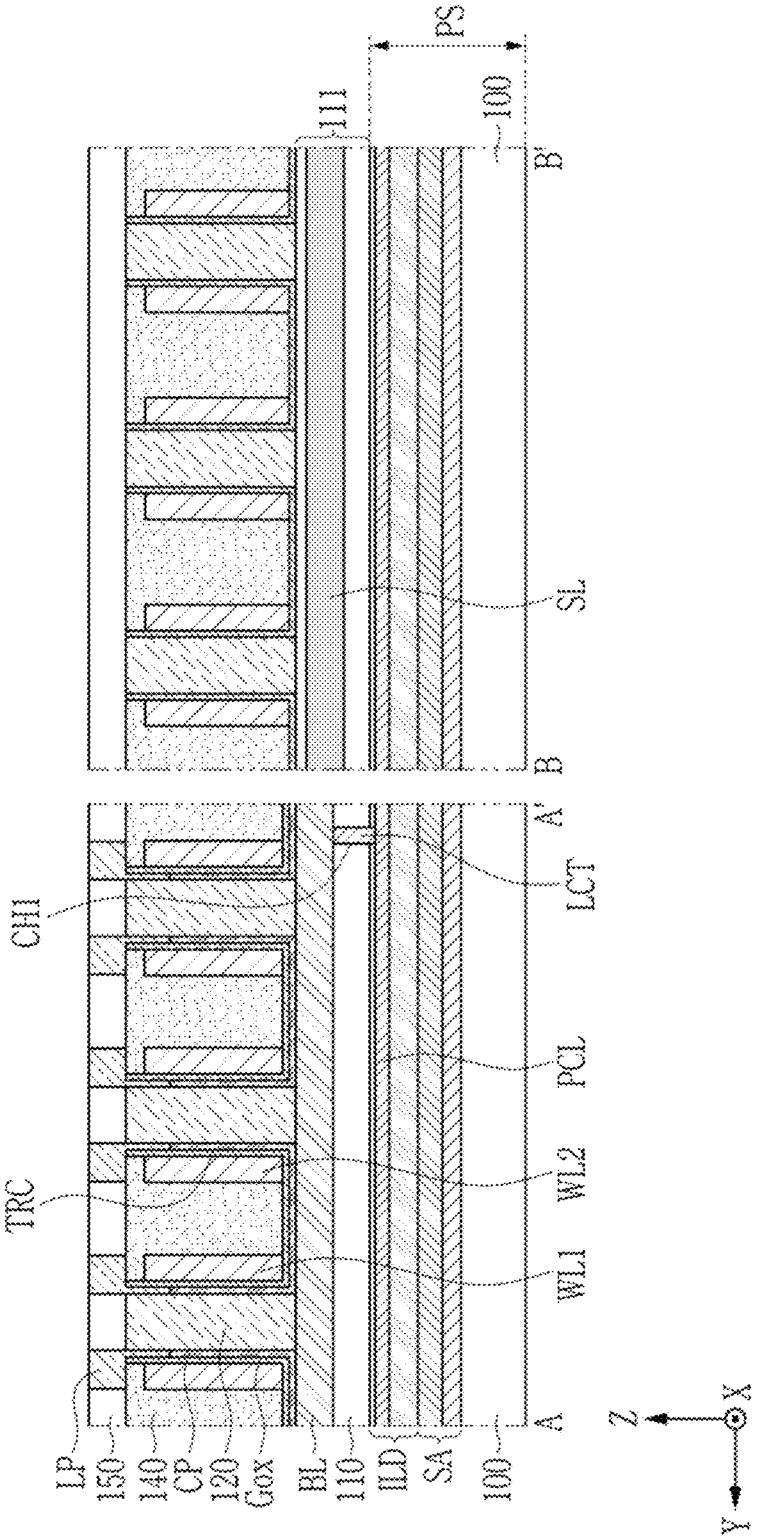
Figure 22:
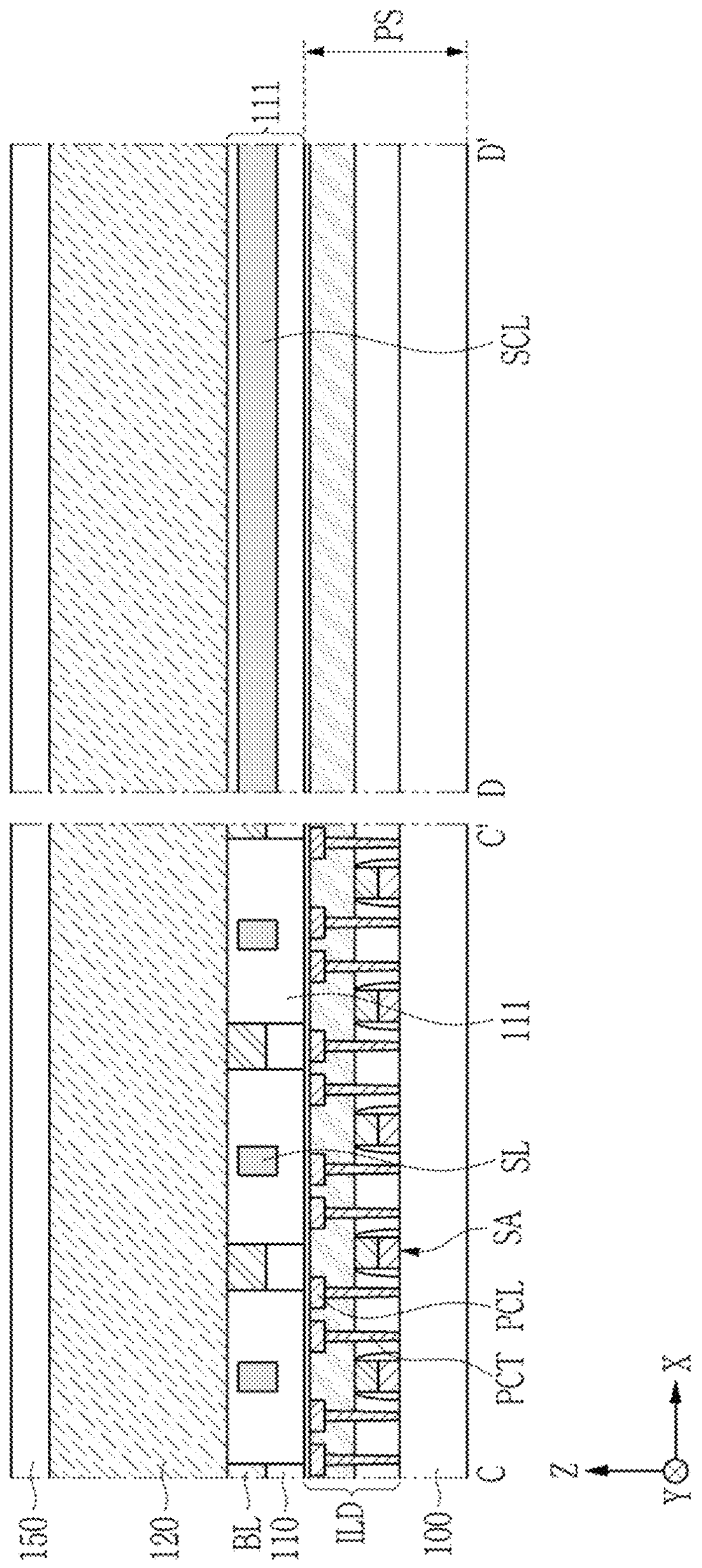

Referring to FIG. 20, FIG. 21, and FIG. 22, a gate insulation pattern Gox and word lines WL1 and WL2 may be formed in the trench TRC.

Specifically, a gate insulation pattern material layer and a word line material layer conformally covering the first insulation pattern 120 and the channel pattern CP may be sequentially deposited.

The gate insulation pattern material layer and the word line material layer may be formed using at least one of techniques of a physical vapor deposition (PVD), a thermal chemical vapor deposition (thermal CVD), a low pressure chemical vapor deposition (LP-CVD), a plasma enhanced chemical vapor deposition (PE-CVD) or an atomic layer deposition (ALD). However, a method of forming the gate insulation pattern material layer and the word line material layer is not limited thereto and may be variously changed.

The gate insulation pattern material layer may include silicon oxide, silicon oxynitride, a high dielectric constant material having a higher dielectric constant than silicon oxide, or a combination thereof.

The word line material layer may include doped polysilicon, metal, conductive metal nitride, conductive metal silicide, conductive metal oxide, or a combination thereof.

The gate insulation pattern material layer and the word line material layer may be patterned to form the gate insulation pattern Gox and the word lines WL1 and WL2 sequentially positioned on the channel pattern CP in the trench TRC.

The gate insulation pattern Gox and the word lines WL1 and WL2 may be a part of each of the gate insulation pattern material layer and the word line material layer remaining in the trench TRC during etching of the gate insulation pattern material layer and the word line material layer.

The gate insulation pattern Gox may be formed on the channel pattern CP in the trench TRC. That is, the gate insulation pattern Gox may be conformally formed along the profile of the channel pattern CP positioned in the trench TRC.

The upper surface of the gate insulation pattern Gox may be positioned on the substantially same level as the upper surface of the first insulation pattern 120. In addition, the gate insulation pattern Gox may be conformally formed along the profile of the side surface of the first insulation pattern 120 and the upper surface of the second insulation layer 111 within the trench TRC.

By performing an anisotropic etching process for the word line material layer, a pair of word lines WL1 and WL2 may be formed separated from each other in the second direction Y in the trench TRC. A pair of word lines WL1 and WL2 may be formed on the gate insulation pattern Gox.

During the anisotropic etching process for the word line material layer, the upper surfaces of the word lines WL1 and WL2 may be lower than the upper surfaces of the first insulation pattern 120 and the gate insulation pattern Gox. In some embodiments, an etching process may additionally be performed to recess the upper surfaces of the word lines WL1 and WL2.

A second insulation pattern 140 filling the trench TRC may be formed on the gate insulation pattern Gox and the word lines WL1 and WL2. That is, after the gate insulation pattern Gox and the word lines WL1 and WL2 are formed, the second insulation pattern 140 may be formed in the remaining trench TRC. The second insulation pattern 140 may fill the trench TRC.

The second insulation pattern 140 may be formed in the trench TRC and cover the word lines WL1 and WL2. The second insulation pattern 140 may fill the trench TRC and cover the side surface and the upper surface of word lines WL1 and WL2. The upper surface of the second insulation pattern 140 may be positioned on the substantially same level as the upper surface of the first insulation pattern 120 and the upper surface of the gate insulation pattern Gox.

The process of forming the second insulation pattern 140 may include a planarization process of exposing the upper surface of the first insulation pattern 120, the upper surface of the channel pattern CP, and the upper surface of the gate insulation pattern Gox. That is, the second insulation pattern 140 may be a part of the second insulation pattern material layer remaining in the trench TRC while the planarization process is being performed.

The second insulation pattern 140 may include, for example, at least one of silicon oxide, silicon oxynitride, silicon nitride, or a low dielectric constant (low-k) material having a smaller dielectric constant than silicon oxide. But the present disclosure is not limited thereto, and the material included in the second insulation pattern 141 may be variously changed.

In an embodiment, landing pads LP connected to the channel pattern CP in the cell array region CAR may be formed.

Specifically, after depositing the landing pad material layer, the landing pad material layer may be patterned to form the landing pads LP connected to the channel pattern CP.

A third insulation layer 150 may be formed, filling a part between the landing pads LP, and a planarization process may be performed. However, the order of forming the landing pads LP and the third insulation layer 150 is not limited thereto, and in some embodiments, after forming and patterning the third insulation layer 150, the landing pads LP penetrating the third insulation layer 150 may be formed.

In an embodiment, the upper surface of the channel pattern CP may be positioned at a lower level than the upper surfaces of the word lines WL1 and WL2. For example, an etching process for recessing a part of the channel pattern CP forming the landing pad LP may be included. That is, by etching the part of the channel pattern CP from the upper surface toward the bottom surface, the trench extending in the third direction Z and defined by the first insulation pattern 120, the upper surface of the channel pattern CP, and the gate insulation pattern Gox may be formed and the landing pad LP may be formed in the trench.

The landing pad LP may include an upper portion having a first width in the second direction Y and a lower portion having a second width in the second direction Y, where the second width is less than the first width. The upper portion of the landing pad LP may be disposed on the second insulation pattern 140. The lower portion of the landing pad LP may extend from a lower surface of the upper portion of the landing pad LP. The lower portion of the landing pad LP may extend from the upper portion of the landing pad LP along a side surface of the upper portion of the landing pad LP. The channel pattern CP, the lower portion of the landing pad LP, and the upper portion of the landing pad LP may include surfaces coplanar in the third direction Z. The lower portion of the landing pad LP may be disposed in the trench extending in the third direction Z and defined by the first insulation pattern 120, the upper surface of the channel pattern CP, and the gate insulation pattern Gox.

The landing pads LP may include a conductive material. For example, landing pads LP may include doped polysilicon, metal, conductive metal nitride, conductive metal silicide, conductive metal oxide, or a combination thereof.

As another example, the landing pads LP may include Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrOx, RuOx or a combination thereof, but is not limited thereto and may be variously changed.

The third insulation layer 150 may include the same material as the first insulation layer 110 and the second insulation layer 111 described above. However, the present disclosure is not limited thereto, and the material included in the third insulation layer 150 may be variously changed.

Figure 23:
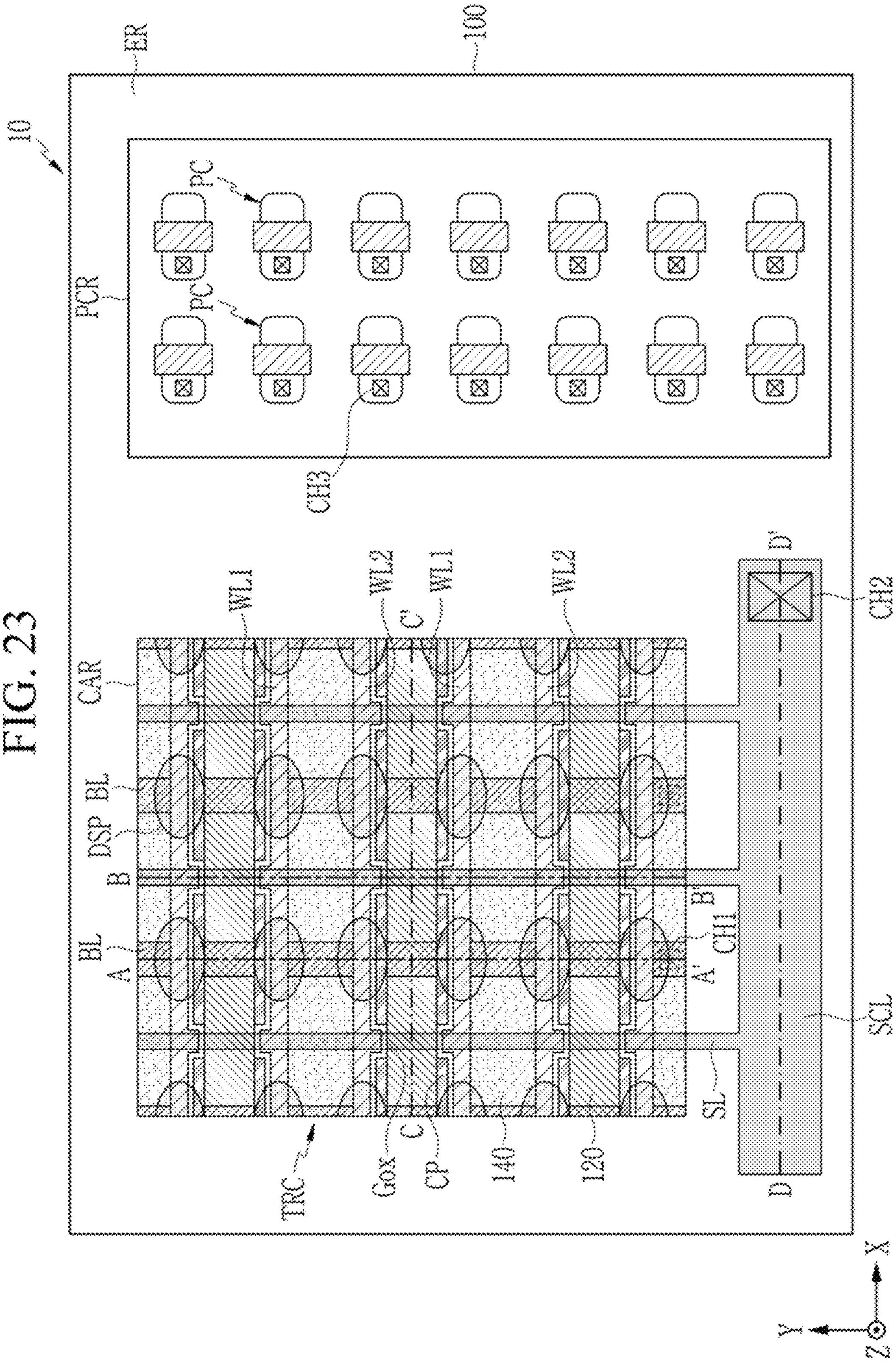
Figure 24:
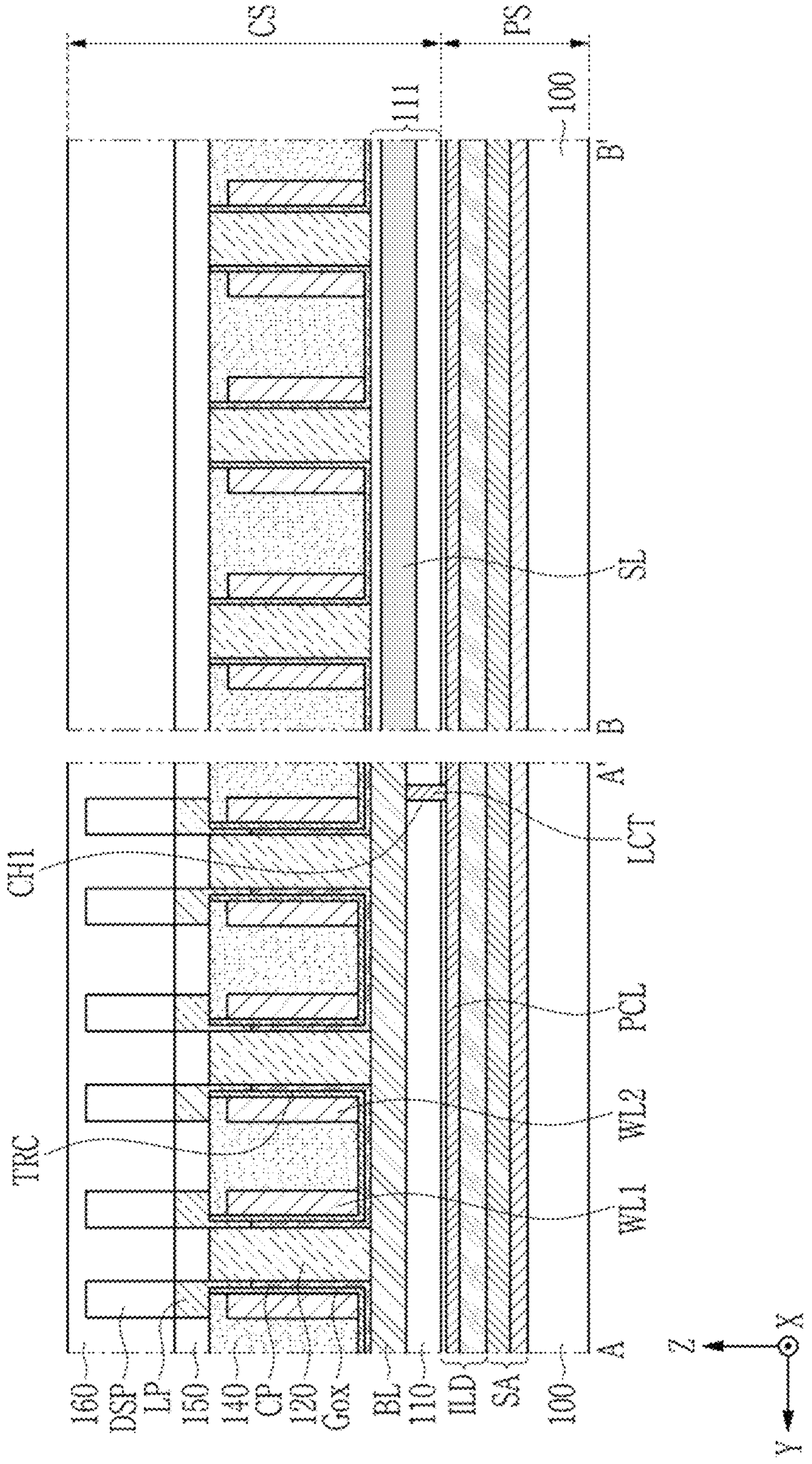
Figure 25:
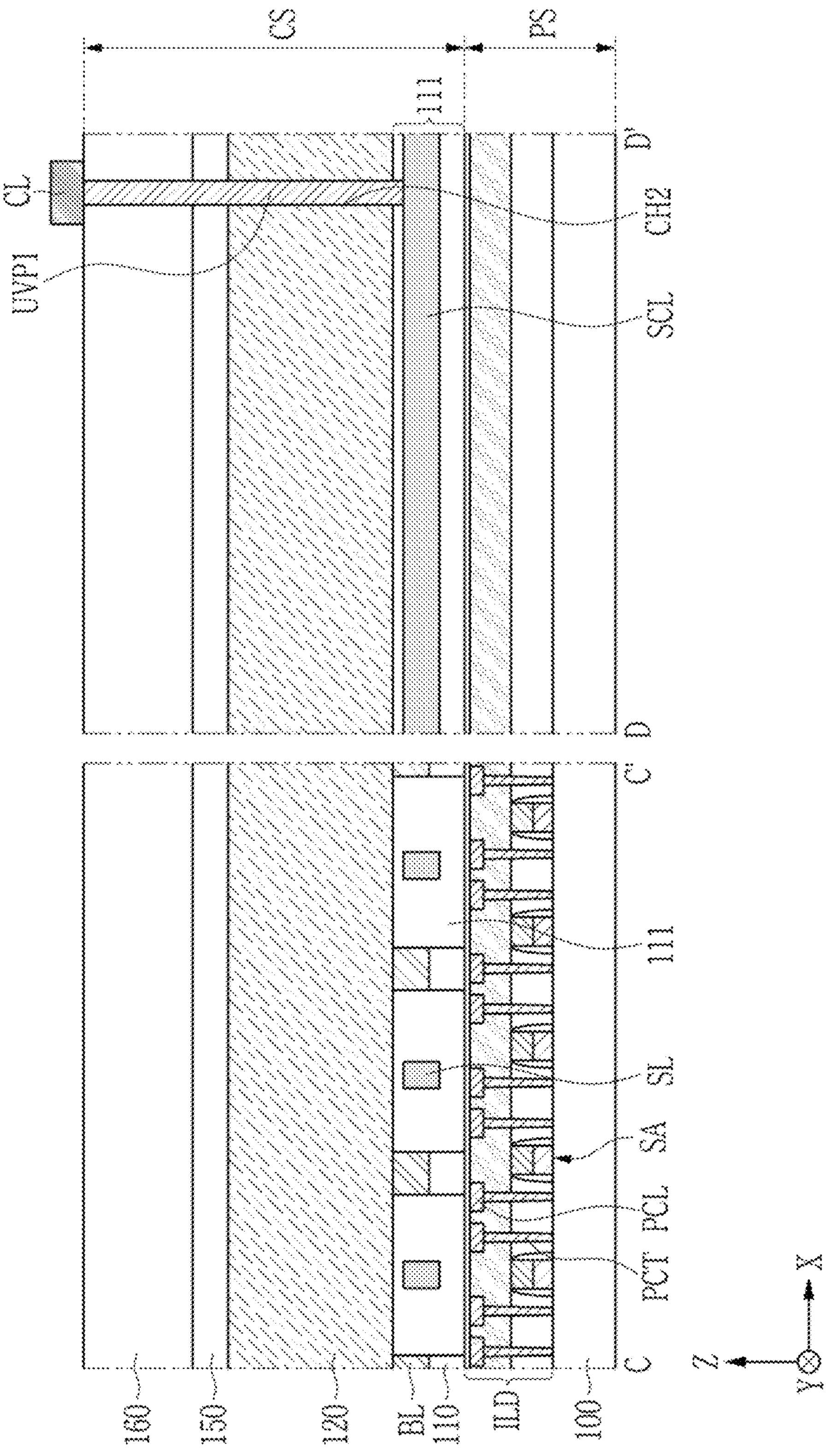

Referring to FIG. 23, FIG. 24, and FIG. 25, in the cell array region CAR of the substrate 100, data storage patterns DSP respectively connected to the landing pads LP may be formed on the landing pads LP.

In the cell array region CAR and the peripheral region ER of the substrate 100, a fourth insulation layer 160 may be formed on the third insulation layer 150. In the cell array region CAR of the substrate 100, the fourth insulation layer 160 may be formed to cover the data storage pattern DSP.

The fourth insulation layer 160 may include the same material as the third insulation layer 150. However, the present disclosure is not limited thereto, and the material included in the fourth insulation layer 160 may be variously changed.

A second contact hole CH2 exposing the upper surface of the shielding contact line SCL may be formed in the peripheral region ER of the substrate 100. That is, the second contact hole CH2 that penetrates the fourth insulation layer 160, the third insulation layer 150, and the first insulation pattern 120 and exposes the upper surface of the shielding contact line SCL positioned within the second insulation layer 111 may be formed.

A first conductive via UVP1 may be formed in the second contact hole CH2. The first conductive via UVP1 may fill the second contact hole CH2.

The first conductive via UVP1 may include at least one metal among aluminum, copper, tungsten, molybdenum and cobalt, but is not limited thereto and may be variously changed.

A connection line CL including a conductive material may be formed on the fourth insulation layer 160. The connection line CL may completely cover the first conductive via UVP1 at a surface of the fourth insulation layer 160. The connection line CL may be electrically connected to the shielding contact line SCL by the first conductive via UVP1. Although not shown, the connection line CL may be electrically connected to a wiring or a circuit for applying a voltage to the shielding line SL.

The process of forming the connection line CL may include the conductive material on the fourth insulation layer 160 includes forming a conductive material layer for forming the connection line CL on the fourth insulation layer 160, and patterning the conductive material layer for forming the connection line CL.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A semiconductor device comprising:
a substrate including a cell array region and a peripheral region surrounding the cell array region;
a bit line positioned in the cell array region and extending in a first direction;
a shielding line extending in the first direction from the cell array region to the peripheral region and positioned adjacent to the bit line in a second direction crossing the first direction;
a shielding contact line positioned in the peripheral region, extending in the second direction, and connected to the shielding line;
a channel pattern positioned on the bit line and extending in a direction vertical from the bit line;
a word line extending in the second direction and positioned on the channel pattern;
a gate insulation pattern positioned between the channel pattern and the word line;
an insulation pattern positioned on the word line;
a landing pad connected to the channel pattern; and
a data storage pattern connected to the landing pad.

2. The semiconductor device of claim 1, wherein:
the shielding line and the shielding contact line are an integral unit.

3. The semiconductor device of claim 1, wherein:
the shielding line is positioned at a center portion between the bit line and an adjacent bit line.

4. The semiconductor device of claim 3, wherein:
the shielding line overlaps the word line, and
the shielding line overlaps a gap in the channel pattern.

5. The semiconductor device of claim 1, wherein:
an upper surface of the shielding line and an upper surface of the shielding contact line are positioned at a level between an upper surface and a bottom surface of the bit line, and
a bottom surface of the shielding line and a bottom surface of the shielding contact line are positioned at a lower level than the bottom surface of the bit line.

6. The semiconductor device of claim 1, wherein:
at least one of a width of the bit line, a width of the shielding line, and a width of the shielding contact line is different.

7. The semiconductor device of claim 6, wherein:
the width of the shielding contact line is greater than the width of the shielding line.

8. The semiconductor device of claim 7, wherein:
the width of the bit line is greater than the width of the shielding line, and the width of the bit line is less than the width of the shielding contact line.

9. The semiconductor device of claim 1, wherein:
The shielding line and the shielding contact line are positioned on substantially a same level, and
the shielding contact line is connected to an end portion of the shielding line positioned in the peripheral region.

10. The semiconductor device of claim 1, further comprising:
an insulation layer covering the data storage pattern;
a conductive pattern positioned on the insulation layer; and
a conductive via connecting the shielding contact line and the conductive pattern.

11. The semiconductor device of claim 10, further comprising:
a conductive pad positioned at a substantially same level as the landing pad,
wherein the conductive via comprises:
a first conductive via connecting the shielding contact line and the conductive pad; and
a second conductive via connecting the conductive pad and the conductive pattern.

12. The semiconductor device of claim 10, wherein:
the conductive via overlaps at least part of the shielding contact line.

13. The semiconductor device of claim 1, wherein:
the bit line and the shielding line include different materials, and
the shielding line and the shielding contact line include a same material.

14. A semiconductor device comprising:
a substrate including a cell array region and a peripheral region surrounding the cell array region;
a plurality of bit lines positioned in the cell array region and extending in a first direction;
a plurality of shielding lines extending in the first direction from the cell array region to the peripheral region and positioned alternately with the plurality of bit lines;

a first shielding contact line extending in a second direction intersecting the first direction in the peripheral region and connected to an end portion of first shielding lines of the plurality of shielding lines;

a second shielding contact line extending in the second direction in the peripheral region and connected to an end portion of second shielding lines of the plurality of shielding lines;

a channel pattern positioned on the plurality of bit lines and extending in a direction vertical to an upper surface of the plurality of bit lines;

a word line extending in the second direction and positioned on the channel pattern;

a gate insulation pattern positioned between the channel pattern and the word line;

an insulation pattern positioned on the word line;

a landing pad connected to the channel pattern; and a data storage pattern connected to the landing pad.

15. The semiconductor device of claim 14, further comprising:

a first insulation layer covering the data storage pattern;

a first conductive via, which penetrates the first insulation layer and is connected to the first shielding contact line; and a second conductive via, which penetrates the first insulation layer and is connected to the second shielding contact line.

16. The semiconductor device of claim 14, wherein:

a first set of the plurality of shielding lines are connected to the first shielding contact line, and a second set of the plurality of shielding lines are connected to the second shielding contact line.

17. The semiconductor device of claim 14, wherein:

a length of the plurality of bit lines along the first direction is different from a length of the plurality of shielding lines along the first direction.

18. The semiconductor device of claim 14, further comprising:

a second insulation layer disposed between the plurality of bit lines and the plurality of shielding lines are buried in the second insulation layer.

19. A semiconductor device comprising:

a substrate including a cell array region and a peripheral region surrounding the cell array region;

a plurality of bit lines positioned in the cell array region and extending in a first direction;

a plurality of shielding lines extending in the first direction from the cell array region to the peripheral region and positioned alternately with the plurality of bit lines;

a shielding contact line extending in a second direction intersecting the first direction in the peripheral region and connected to the plurality of shielding lines;

a channel pattern positioned on the plurality of bit lines and extending in a direction vertical to an upper surface of the plurality of bit lines;

a word line extending in the second direction;

a gate insulation pattern positioned between the channel pattern and the word line;

an insulation pattern positioned on the word line;

a landing pad connected to the channel pattern;

a data storage pattern connected to the landing pad; and a conductive via connected to a portion of the shielding contact line in the peripheral region.

20. The semiconductor device of claim 19, wherein:

a length of the plurality of shielding lines along the first direction is longer than a length of the plurality of bit lines along the first direction, and a width of each of the plurality of shielding lines is smaller than a width of the shielding contact line.

* * * * *